United States Patent [19]

Yoneda

[11] Patent Number: 5,517,509
[45] Date of Patent: May 14, 1996

[54] DECODER FOR DECODING ECC USING EUCLID'S ALGORITHM

[75] Inventor: Minoru Yoneda, Tokyo, Japan

[73] Assignee: Kabushiki Kaisha Toshiba, Kawasaki, Japan

[21] Appl. No.: 220,616

[22] Filed: Mar. 31, 1994

[30] Foreign Application Priority Data

Mar. 31, 1993 [JP] Japan .................................. 5-074652
Aug. 6, 1993 [JP] Japan .................................. 5-196469

[51] Int. Cl.⁶ .......................... G06F 11/10; H03M 13/00
[52] U.S. Cl. .............................................. 371/37.1; 341/94
[58] Field of Search ................................ 371/37.1, 37.5, 371/43; 341/94

[56] References Cited

U.S. PATENT DOCUMENTS

| | | | |
|---|---|---|---|
| 4,649,541 | 3/1987 | Lahmeyer | 371/37.1 |
| 4,719,628 | 1/1988 | Ozaki et al. | 371/37.4 |
| 4,841,300 | 6/1989 | Yoshida et al. | 341/94 |
| 4,868,828 | 9/1989 | Shao et al. | 371/37.5 |
| 4,873,688 | 10/1989 | Maki et al. | 371/37.1 |
| 5,099,482 | 3/1992 | Cameron | 371/37.1 |
| 5,130,990 | 7/1992 | Hsu et al. | 371/37.1 |
| 5,170,399 | 12/1992 | Cameron et al. | 371/37.1 |
| 5,297,153 | 3/1994 | Baggen et al. | 371/37.1 |
| 5,365,529 | 11/1994 | Mester | 371/37.1 |

FOREIGN PATENT DOCUMENTS

| | | |
|---|---|---|
| 0295949 | 12/1988 | European Pat. Off. . |
| 0413856 | 2/1991 | European Pat. Off. . |
| 4105860 | 8/1992 | Germany . |
| 2259378 | 3/1993 | United Kingdom . |
| 2262371 | 6/1993 | United Kingdom . |

Primary Examiner—Paul P. Gordon
Attorney, Agent, or Firm—Cushman, Darby & Cushman

[57] ABSTRACT

A decoder in the form of a Euclid's algorithm operation circuit in which division polyonomials are repeatedly divided by residues resulting from the division process of dividend polynomials and division polynomials until the degree of residues of the division process satisfies a prescribed condition. The Euclid's algorithm operation circuit comprises register groups for storing dividend polynomials and division polynomials, respectively, a feedback loop for storing residues resulting from the division process of the dividend polynomials by the division polynomials, a shifter for shifting contents of registers, and an exchanger for exchanging coefficients of the dividend polynomials with coefficients of the division polynomials. The decoder comprises a syndrome operator for calculating syndromes from received code-words, an erasure locator generator for generating erasure locator data from erasure locator flags synchronous with received code-words, a modified syndrome generator for generating modified syndromes, an erasure locator polynomial generator for generating erasure locator polynomials from the erasure locator data, a Euclid's algorithm operation circuit for obtaining error locator polynomials and error value polynomials, a Chien searcher for obtaining error locations and error values and a correction processor for correcting errors of the received code-word. The modified syndrome generator and the erasure locator polynomial generator are used jointly with the Euclid's algorithm operation circuit.

6 Claims, 17 Drawing Sheets

$$aX^3+bX^2+cX+d \overline{\smash{\big)}\begin{array}{l} 1/aX+b/a^2 \\ \hline X^4 \\ X^4+b/aX^3+c/aX^2+d/aX \\ \hline b/aX^3+c/aX^2+d/aX \\ b/aX^3+b^2/a^2X^2+bc/a^2X+bd/a^2 \\ \hline (b^2/a^2+c/a)X^2+(bc/a^2+d/a)X+bd/a^2 \end{array}}$$

DECODER FOR DECODING ECC USING EUCLID'S ALGORITHM

FIELD OF THE INVENTION

The present invention generally relates to a decoder, and more particularly, to a decoder suitable for decoding error correction codes of Goppa code including Reed Solomon (RS) code and Bose-Chaudhuru-Hocqenghem (BCH) code.

BACKGROUND OF THE INVENTION

In order to promote reliability of various digital systems, it has become necessary to apply error correction codes in recent years. Various kinds of error correction codes have been adopted corresponding to various systems.

In particular, Reed Solomon code (hereinafter referred to as RS code) is an important code which has low redundancy and is widely used in the fields of CD (Compact Disk), DAT (Digital Audio Tape) and satellite communication.

There are various methods proposed for decoding RS code. For correction of a few symbols, for instance, two or three symbols, it is possible to obtain error locations and error values through an algebraic function using RS code and it is easy to devise a decoder for this purpose. However, in a system requiring high reliability, it is necessary to increase the error correction capability. In this case, the Peterson algorithm, the Berlekamp-Massey algorithm or the Euclid's algorithm is used. In these algorithms, decoding is performed by setting up error locator polynomials and error evaluator polynomials and obtaining error locations and error values according to the Chien searcher. Circuits for enabling this type of decoding are extremely large and require large calculation times.

Next, the RS code will be briefly described.

The RS code comprises Galois field GF elements. If a code length is n, the minimum distance (Hamming distance) is d, and having k information bearing symbols in an RS code on Galois field $GF(2^n)$ comprising $2^n$ elements, the RS code satisfies the following equations (1) and (2):

$$n \leq 2^n - 1 \tag{1}$$

$$n = k + (d-1) \tag{2}$$

The error correction capability t of this RS code can be expressed by the following equation (3):

$$t = (d-1)/2 \tag{3}$$

A generator polynomial G(X) has degrees equivalent to code check symbols (n–k) (=d–1=2t) and is divisible $X^{n-1}$. If the primitive element of $GF(2^n)$ is $\alpha$, the generator polynomial G(X) of the RS code can be expressed by the following equation (4):

$$G(X) = (X-\alpha) \cdot (X-\alpha^2) \ldots (X-\alpha^{2t}) \tag{4}$$

Further, G(X) can optionally be replaced by the following equation (5).

$$G(X) = (X-1) \cdot (X-\alpha) \ldots (X-\alpha^{2t-1}) \tag{5}$$

Next, the encoding will be described.

A coding polynomial C(X), once encoded must be divisible by a generator polynomial G (X). If an information symbol of size k to be encode is I and this information is expressed by a polynomial, the information-bearing symbol polynomial I is expressed by the following equation (6):

$$I(X) = Cn-1 \cdot X^{n-1} + Cn-2 \cdot X^{n-2} + Cn-k \cdot X^{n-k} \tag{6}$$

A residue polynomial, P(X), obtained by dividing the information-bearing symbol polynomial G(X) by the generator polynomial P(X) is expressed by the following equation (7).

$$\begin{aligned} P(X) &= I(X) \cdot \bmod G(X) \\ &= Cn-k-1 \cdot x^{n-k-1} + \\ &\quad Cn-k-2 \cdot x^{n-k-2} + \ldots + C0 \end{aligned} \tag{7}$$

and a coding polynomial C(X) is provided by the following equation (8):

$$C(X) = I(X) + P(X) \tag{8}$$

It is apparent that the coding polynomial, C(X), of the equation (8) is divisible by G(X).

Next, the encoding will be described.

FIG. 1 is a circuit diagram showing a conventional decoder for decoding error correction code. The decoder shown in FIG. 1 is that disclosed in the Japanese Patent Official Gazette (TOKU-KO-HEI) 4-7847.

The decoder shown in FIG. 1 is based on the systolic algorithm. If no erasure is taken into considertion, the decoding is carried out following procedures (1) through (5):

(1) Syndrome calculation is carried out.

(2) If all syndromes are 0, it is judged that there is no error.

(3) Using the Peterson algorithm or Euclid's algorithm, an error locator polynomial $\sigma(X)$ and an error value polynomial $\omega(X)$ are obtained.

(4) According to the Chien searcher, a root of $\sigma(X)$, i.e., an error location is obtained.

(5) A root of $\omega(X)$, an error value is obtained.

The coding polynomial C(X) of equation (8) is subjected to the effects of noise in a transmission line and changes to a received polynomial Y(X). This received polynomial Y(X) is the sum of the coding polynomial C(X) and the error evaluator polynomial $\sigma(X)$.

First, in step (1), syndromes S1, S2, ... S2t are calculated from the received polynomial Y(X). In a BCH code having roots of $\alpha, \alpha^2, \ldots, \alpha^{2t}$, syndromes are defined by the equation (9):

$$Si = Y(\alpha^i), (i=1,2,\ldots,2t) \tag{9}$$

As $C(\alpha i) = 0$, (i=1,2, ... 2t), a syndrome will be:

$$Si = E(\alpha^i), (i=1, 2, \ldots, 2t) \tag{10}$$

and if there is no error, all the syndromes will become 0.

Errors e1, e2, ..., eL are generated at locations j1, j2, ... jL, where L≤t. The following equation (11) is also established;

$$E(X) = e1 \cdot X^{j1} + e2 \cdot X^{j2} + \ldots + eL \cdot X^{jL} \tag{11}$$

equation (12) is obtained from the-equation (10).

$$\begin{aligned} Si &= e1 \cdot \alpha^{ij1} + e2 \cdot \alpha^{ij2} + \ldots + eL \cdot \alpha^{ijL} \\ (i &= 1, 2, \ldots, 2t) \end{aligned} \tag{12}$$

Therefore, error locations j1, j2 ..., jL and error values e1, e2 ..., eL can be obtained from the S1, S ... S2t.

However, it is difficult to obtain the error values directly from syndromes. We first obtain an L degree polynomial on the Galois field $GF(2^n)$ shown in the equation (13):

$$\sigma(Z) = (1-\alpha^{j1} \cdot Z) \cdot (1-\alpha^{j2} \cdot Z) \ldots (1-\alpha^{jL} \cdot Z) \tag{13}$$

Equation (13) is called an error locator polynomial with roots that correspond to error locations.

If syndrome S(Z) is assumed to be as shown by equation (14), and attention is paid to equation (15), equation (16) is obtained:

$$S(Z) = S1 + S2 \cdot Z + \ldots S2t \cdot Z^{2t-1} \quad (14)$$

$$ei \cdot \alpha^{ji}/(1 - \alpha^{ji} \cdot Z) = \quad (15)$$

$$e1 \cdot \alpha^{j1} + ei \cdot \alpha^{2ji} \cdot Z + ei \cdot \alpha^{3ji} \cdot Z^2 + \ldots$$

$$S(Z) = \sum_{i=1}^{L} ei \cdot \alpha^{ji}/(1 - \alpha^{ji} \cdot Z) \cdot \bmod Z^{2t} \quad (16)$$

When σ(Z) is applied to both sides of the equation (16), the following equation (17) is obtained:

$$\sigma(Z) \cdot S(Z) = \omega(Z) \cdot \bmod Z^{2t} \quad (17)$$

Equation (17) can be replaced by equation (18), in using an appropriate polynomial A(Z).

$$A(Z) \cdot Z^{2t} + \sigma(Z) \cdot S(Z) \quad (18)$$

ω (Z) of equation (18) is called an error evaluator polynomial and is defined by equation (19).

$$\omega(Z) = \sum_{i=1}^{L} ei \prod_{k=1}^{L} (1 - \alpha^{jk} \cdot Z) \quad (19)$$

Here, relations of [deg σ (Z)≦t] and [deg ω (Z)≦t−1] (deg denotes degree) are established. Further, as [ω(α⁻ⁱ¹)≠0] (i=1, . . . , L) and both ω (Z) and σ (Z) disjoint one another, it is possible to obtain ω (Z) and σ (Z) in the process of the Euclid's algorithm for obtaining the greatest common divisor (GCD) polynomial of $Z^{2t}$ and S(Z).

Next, Euclid's algorithm that is adopted in Procedure (3) will be described.

Now, when two polynomials r−1 (Z) and r0 (Z) are applied and deg r0≦deg r−1, the following divisions (20) through (23) are repeated.

$$r-1(Z)=q1(Z) \cdot r0 (Z)+r1 (Z), \text{ deg } r1 \leq \text{deg } r0 \quad (20)$$

$$R0 (Z)=q2 (Z) \cdot r1 (Z)+r2 (Z), \text{ deg } r2 \leq \text{deg } r1 \quad (21)$$

$$rj-2(Z)=qj(Z) \cdot rj-1(Z)+rj (Z), \text{ deg } rj \leq \text{deg } rj-1 \quad (23)$$

$$rj-1(Z)=qj+1(Z) \cdot rj(Z) \quad (24)$$

And, the last divided non-zero rj(Z) becomes the greatest common divisor (GCD) of r−1(Z) and r0 (Z).

Here, the following theorem is used.

When two polynomials r−1(Z) and r0 (Z) are applied, deg r0 ≦deg r−1 and GCD=h(Z) which satisfy, there exist U(Z) and V(Z) equation (24) and both deg U and deg V are smaller than deg r−1.

$$U(Z) \cdot r-1(Z)+V(Z) \cdot r0(Z)=h(Z) \quad (24)$$

Assuming r−1(Z)=$Z^{2t}$ and r0(Z)=S(Z), polynomials ri(Z), Ai(Z) and Bi(Z) satisfy equation (25) are sequentially calculated using the above theorem.

$$A(Z) \cdot r-1(Z)+Bi(Z) \cdot r0(Z)=ri(Z) \quad (25)$$

And if Bi(Z) becomes less than degree t and residue ri(Z) becomes less than deg (t−1), Bi(Z) and ri(Z) become possible substitutes of ε (Z) and ω (Z), respectively. Therefore, assuming that A−1 (Z)=1, A0(Z)=0, B−1(Z)=0 and B0 (Z)=1, ri (Z) , Ai (Z) and Bi (Z) are calculated as shown below.

$$ri(Z)=ri-2(Z)-qi(Z) \cdot ri-1(Z) \quad (26)$$

$$Ai(Z)=Ai-2(Z)-qi(Z) \cdot Ai-1(Z) \quad (27)$$

$$Bi(Z)=Bi-2(Z)-qi(Z) \cdot Bi-1(Z) \quad (28)$$

And when the degree of ri(Z) becomes less than (t-1) through the above arithmetic operations, the following equations (29) and (30) are obtained.

$$\sigma1(Z)=Bi(Z) \quad (29)$$

$$\omega1(Z)=ri(Z) \quad (30)$$

An error value ei is obtained according to the following equation (31) by using the roots of σ (X) and ω (X) obtained through Euclid's algorithm.

$$ei=-\omega(\alpha^{-ji})/\sigma'(\alpha^{-ji}), (i=1, \ldots, L) \quad (31)$$

where, σ' (Z) is a derivative of σ (Z), which is a differential of σ (Z). This σ'(Z) is expressed by the following equations (32) and (32) which are composed of only odd numbered terms taken out of σ (Z).

$$\sigma'(Z)=\sigma1+\sigma3 \cdot Z^2+\sigma5 \cdot Z^4+ \ldots +\sigma L \cdot Z^{L-1} \text{ (L:odd number)} \quad (32)$$

$$\sigma'(Z)=\sigma1+\sigma3 \cdot Z^2+\sigma5 \cdot Z^4+ \ldots +\sigma L \cdot Z^{L-2} \text{(L:even number)} \quad (33)$$

Encoding and decoding of RS code are thus completed.

Further, the decoder, as shown in FIG. 1, has not only the erasure correcting function but also the erasure correcting function using an erasure locator flag signal. An erasure locator flag is used to indicate that a symbol seems erroneous. A flag output circuit 201 outputs this erasure locator flag in synchronism with a received code-word that is input through the input terminal r.in. An erasure locator coefficient αi indicating an erasure location is generated by erasure locator generator 202.

On the other hand, a received code-word that is input through the input terminal r.in is supplied to a syndrome cell circuit 203 to generate a syndrome S(X). The erasure locator coefficient $\alpha^i$ and syndrome S(X) are supplied to an erasure locator coefficient latch 205 and a modified syndrome cell circuit 206 through an interface (hereinafter referred to as I/F 204. The modified syndrome cell circuit 206 prepares a modified syndrome Sε (X) with erasure locator information removed from information on the syndrome S(X). FIG. 2 is a block diagram showing a specified arrangement of the modified syndrome cell circuit 206.

The modified syndrome cell circuit 206 is arranged by connecting 2t pieces of the cell, as shown in FIG. 2. The syndrome S(X) is supplied to a latch 221 as an input Yin, as shown in FIG. 2. When the latch 221 loads the syndrome S(X), the erasure locator coefficient $\alpha^i$ is input to a latch 222. A control circuit 224 controls latches 225 and 226, adder 227 and a multiplier 228 based on a command from latch 223 and obtains the modified syndrome S(X) by performing a calculation of the following equation (34).

$$S\epsilon(X)=(X-\alpha^i) \cdot S(X) \bmod X^{2t} \quad (34)$$

The result of the calculation is supplied to latch 230 through a multiplier (MUX) 229 and then output therefrom. Further, 2t steps are needed for the calculation of the above equation (34). After the calculation has been completed, the modified syndrome coefficient is held in the register of each cell and the modified syndrome Sε (X) is output, when the decoder is put in the 2t step output mode.

The modified syndrome Sε (X) obtained from the modified syndrome cell circuit 206 is supplied to both a GCD (Greatest Common Divisor) cell circuit 208 and an erasure locator coefficient latch 209 through an I/F 207. Further, the outputs from the erasure locator coefficient latch 209 and the GCD cell 208 are supplied to both a multiplier cell circuit 211 and an error-erasure value polynomial latch 212 through an I/F 210. The GCD cell circuit 208 obtains a data of series of coefficients of both an error locator polynomial σ e(X) and an error-erasure value polynomial n(X) from the modified syndrome data series. Further, the multiplier cell circuit 211 obtains coefficient data of an error-erasure value polynomial n(X) from both an error locator polynomial σ e(X) and an erasure locator data series. In addition, the I/F circuit 213 obtains a differential σ' (X) of an error erasure locator polynomial σ (X) and outputs it to an evaluation cell circuit 214 together with the error-erasure value polynomial n(X).

The evaluation cell circuit 214 obtains an error value by the calculation according to the following equation (35) at a location i where an error locator polynomial $\sigma(\alpha^i)$ becomes 0.

$$n(\alpha^i)/\sigma'(\alpha^i) \quad (35)$$

An error value obtained by the evaluation cell circuit 214 is supplied to an adder 216 through a gate circuit 215. This gate circuit 215 determines if an error is generated at the location i when the error locator polynomial $\sigma(\alpha^i)$ is 0, and supplies the error value to an adder 216. The adder 216, being supplied with a received code-word from a buffer memory 217, corrects an error by an addition of the Galois fields of the data at the received code-word i with an error value at the location i and outputs to an output terminal 218. Where, COMin, as shown in FIG. 1, represents a command input of each circuit.

The decoder, as shown in FIG. 1, is capable of pipeline processing and is excellent in high speed processing. However, it was defective in that it's circuit was too large and uneconomical for processing in a large scale integration.

The longest calculation time is required for the process to obtain the error locator polynomial σ (Z) and the error evaluator polynomial ω (Z) from syndromes. The circuit size corresponding to this process is very large. A proposal for reducing the circuit scale of this portion was disclosed in the Japanese Patent Disclosure (TOKU-KAI-SHO) 63-157528. FIGS. 3 and 4 are block diagrams showing this proposal, respectively. FIG. 3 shows processing elements for generating a GCD and FIG. 4 shows the entire circuit arrangement using the processing elements shown in FIG. 3.

In this proposal, a systolic algorithm is adopted. This systolic algorithm obtains σ (X) and ω (X) in the same process as for obtaining a GCD using the Euclid's algorithm, and the degree is reduced by alternately multiplying the maximum degree coefficients of two polynomials. Further, in the actual circuit, in order to obtain σ (X) and ω (X), it is necessary to use the circuit twice, as shown in FIG. 4, or to provide two circuit systems.

Thus, in a conventional Euclid's algorithm operation circuit, one basic processing circuit is composed of two multipliers, an adder, a three-input two-output multiplexer and seven registers. The circuit scale is extremely large, as shown in FIG. 3. If one symbol is comprised of 8 bits as in, for instance, RS code on a Galois field $GF(2^8)$, when the number of gates is obtained in a unit of NAND gate, it is necessary to arrange about 1.2K gates.

Actually, (2t+2) pieces of this basic circuit are used and therefore, if 2t=10, 14.4K gates must be arranged. Further, to assure a high speed decoding, it is necessary to provide two circuits, as shown in FIG. 4, as the circuit cannot be used twice. In this case, if LDC (Long Distance Code) is adopted and it is assumed that [2t=16], then 21600 gates will be required, resulting in an enormous circuit scale.

As described above, a conventional decoder has a problem in that its circuit scale is too large be suitable for large scale integration.

SUMMARY OF THE INVENTION

It is an object of the present invention to provide a decoder of reduced circuit scale without impairing a high speed efficiency.

In order to achieve the above object, a decoder according to one aspect of the present invention, i.e., a Euclid's algorithm operation circuit is used in which division polynomials are repeatedly divided by residues resulting from the division process of dividend polynomials and division polynomials until degree of residues of the division process satisfies a prescribed condition. The Euclid's algorithm operation circuit according to a first embodiment of the present invention is characterized in that it comprises a first and a second register groups having a plurality of register for storing the dividend polynomials and the division polynomials, respectively, a feedback loop for storing residues resulting from the division process of the dividend polynomials by the division polynomials in respective registers of the first register group using the first and the second register groups, a shifter for shifting contents of respective registers of the first register group in the next stage whenever one division process is completed until the maximum degree coefficient of the division polynomial becomes non-zero, and an exchanger for exchanging coefficients of the dividend polynomials with coefficients of the division polynomials.

In the Euclid's algorithm operation circuit having the above construction, the feedback loop stores residues resulting from the division process in respective registers of the first resister group. Dividend polynomials are repeatedly divided by the stored residues. If the maximum degree coefficient of residues is 0, the division will become impossible, and therefore the shifter shifts the registers to the next stage of registers until the maximum degree coefficient reaches non-zero. As the exchanger exchanges contents of dividend polynomials with those of division polynomials, it becomes possible to reduce the circuit scale to one smaller than that of conventional circuits.

A decoder according to the second aspect of the present invention, which include the above Euclid's algorithm operation circuit, comprises a syndrome operator for calculating syndromes from received code-words, an erasure locator generator for generating erasure locator data from erasure locator flags synchronizing with received code-words, a modified syndrome generator for generating modified syndromes excepting erasure locator information from the syndromes, an erasure locator polynomial generator for generating erasure locator polynomials from the erasure locator data, a Euclid's algorithm operation circuit for obtaining error locator polynomials and error value polynomials from the modified syndromes and the erasure locator polynomials, a Chien searcher for obtaining error locations and error values from the error locator polynomials and the error value polynomials obtained by the Euclid's algorithm operation circuit, a correction processor for correcting errors of the received code-word based on error locations and error values obtained by the Chien searcher, and characterized in that, the modified syndrome generator and the erasure locator polynomial generator are used jointly with the Euclid's algorithm operation circuit.

In the decoder described above, a modified syndrome generator and an erasure locator polynomial generator are used jointly with the Euclid's algorithm operation circuit. As a result, the circuit scale is reduced. Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
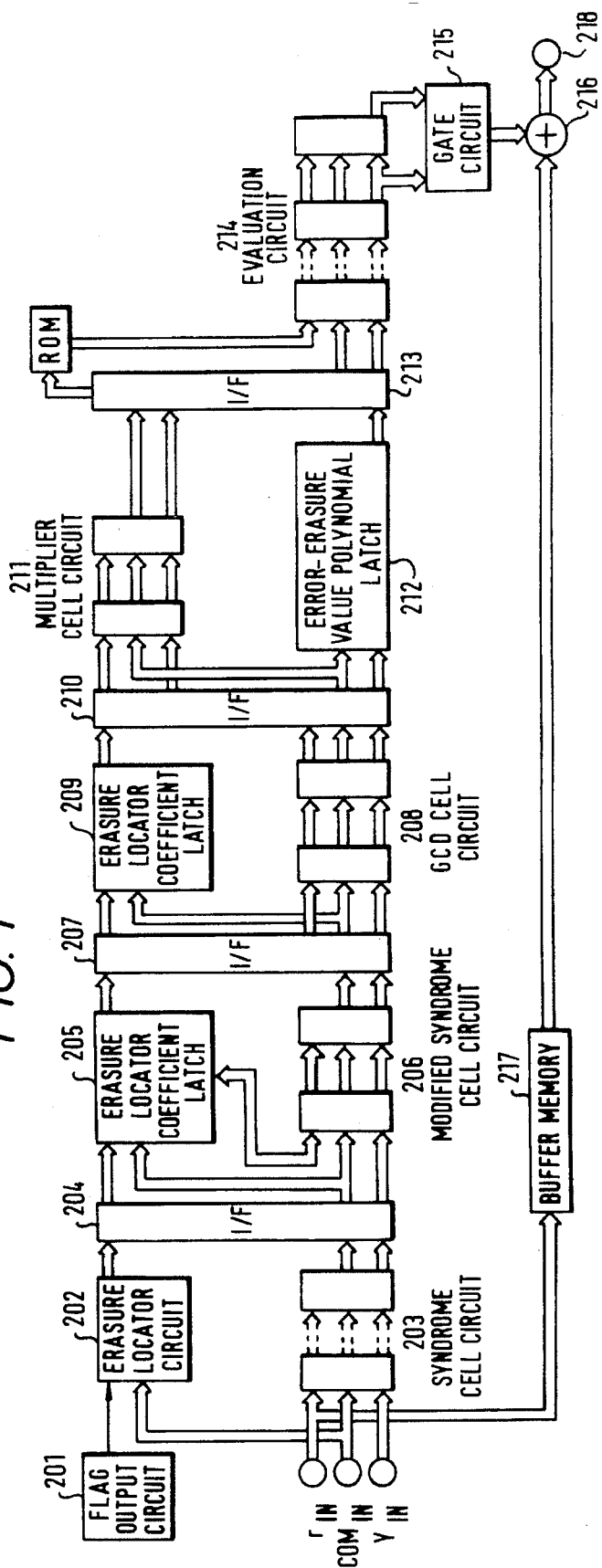
FIG. 1 is a circuit diagram showing a conventional decoder.

The present invention will be described in detail with reference to FIGS. 5 through 22.

Throughout the drawings, like or equivalent reference numerals or letters will be used to designate like or equivalent elements for simplicity of explanation.

Figure 5:
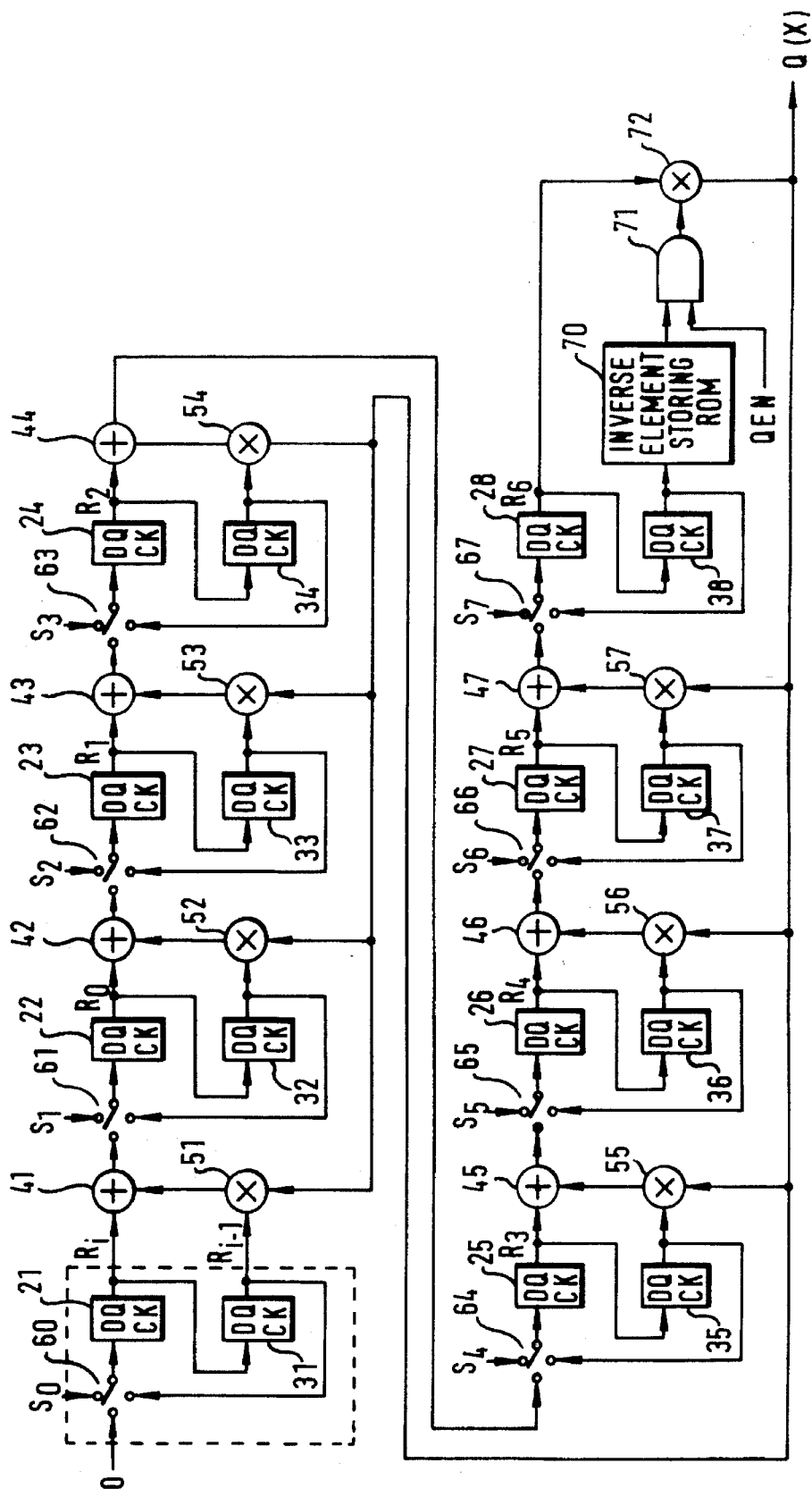
FIG. 5 is a block diagram showing one embodiment of a divider adopted in the Euclid's algorithm operation circuit according to a first embodiment of the present invention.

Referring now to FIG. 5, a first embodiment of the decoder according to the present invention, i.e., a Euclid's algorithm operation circuit will be described in detail.

FIG. 5 is a block diagram showing one embodiment of a divider adopted in the Euclid's algorithm operation circuit according to the present invention.

Figure 6:
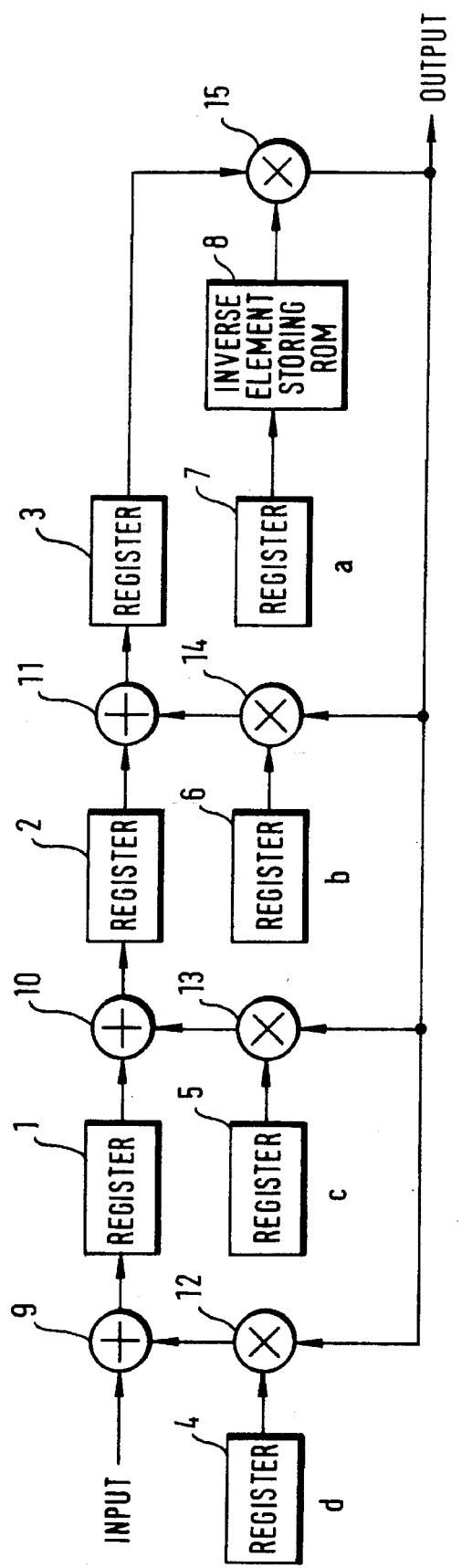
FIG. 6 is a block diagram for explaining the principle of the embodiment shown in FIG. 5.

Referring now to FIG. 6, the principle of a division polynomial adopted in this embodiment will be described.

As an example of the division, $[X^4+aX^3+bX^2+cX+d]$ which is a division of a dividend polynomial by a division polynomial will be considered. In FIG. 6, resisters 1 through 3 are provided for storing coefficients of dividend polynomials. Registers 5 through 7 are storing division polynomial coefficients d, c, b and a, respectively, and outputs the coefficients d, c, b and a to multipliers 12 through 14 and an inverse element storing ROM 8. The inverse element storing ROM 8 supplies inverse elements of the contents of the resister 7 to a multiplier 15.

TABLE 1

| Content | Timing | | | | | | |
|---|---|---|---|---|---|---|---|
|  | t0 | t1 | t2 | t3 | t4 | t5 | t6 |
| Input | 0 | 1 | 0 | 0 | 0 | 0 | 0 |
| Output | 0 | 0 | 0 | 0 | 1/a | $b/a^2$ |  |
| Register 1 | 0 | 0 | 1 | 0 | 0 | d/a | $bd/a^2$ |
| Register 2 | 0 | 0 | 0 | 1 | 0 | c/a | $bc/a^2 + d/a$ |
| Register 3 | 0 | 0 | 0 | 0 | 1 | b/a | $b^2/a^2 + c/a$ |

Table 1 shown above indicates inputs/outputs and contents of the registers 1 through 3 at timings t0 through t6. Dividend polynomials are supplied to an adder 9 sequentially from the maximum degree. As shown in Table 1, at the time t0, registers 1 through 3 are initialized to 0. At time t1, coefficient $X^4$ of the maximum degree X of a dividend polynomial is input. Thereafter, at time t2 through t6, coefficients of input dividend polynomials are all zero. Also, at time t2, output is 0 and the adder 9 adds up 0 from a multiplier 12 and input 1 and stores the result in the resister 1. The contents of the register 1 are transferred to registers 2 and 3 sequentially at the times t3 and t4.

When the contents of the register 3 becomes 1 at time t4, the multiplier 15 multiplies 1/a from the inverse element storing ROM 8 and outputs a quotient of the maximum degree for the first time. This quotient is fed back to the multipliers 12 through 14 and multiplied by the coefficients d through a, respectively and d/a, c/a and b/a are stored in the registers 1 through 3, respectively. As a result, quotient at time t5 will become $b/a^2$. The output is completed at time t5.

Figures 3, 7:
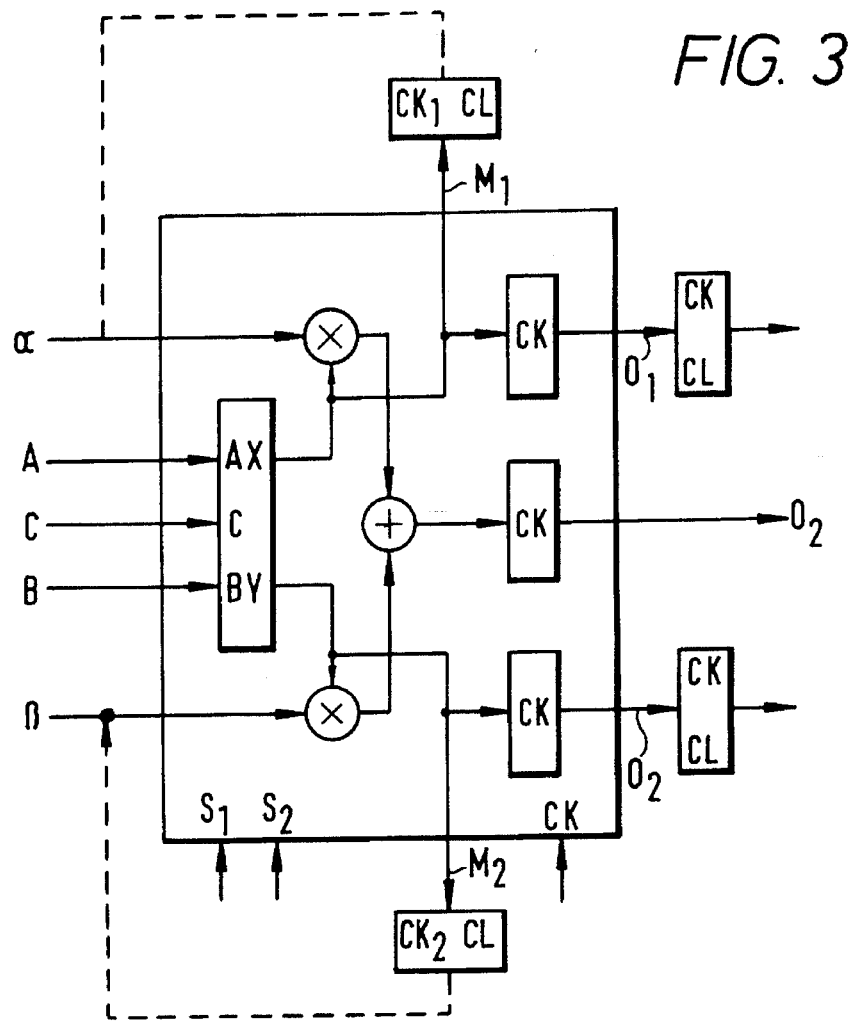
FIG. 3 is a block diagram showing processing elements comprising a conventional Euclid's algorithm operation circuit.
FIG. 7 is an explanatory diagram for explaining the principle of the embodiment shown in FIG. 5.

Thereafter, the same operation is repeated and at time t6, residues are stored in the registers 1 through 3. FIG. 7 shows a computation of the division process described above. The circuit shown in FIG. 6 carries out the same operation as the computation shown in FIG. 7 and the same result as that of the computation in FIG. 7 is obtained.

Until that time when the maximum degrees other than zero of dividend polynomials are stored in the register 3, that is, for the period of time t0 through t3, the maximum degrees only are shifted and coefficients of the maximum degrees other than zero of dividend polynomials may be stored in the register 3 and coefficients below the maximum degrees may be in parallel stored in the registers 2 and 1. In this case, only the operations at times t4 through t8 are sufficient.

Further, when a degree difference between a dividend polynomial and a division polynomial is 1 as in this case, the computation must be completed in two clocks.

FIG. 5 is a block diagram showing a divider to be incorporated in this embodiment.

Registers 21 through 28 are for storing coefficients of a dividend Ri−2(X) and resisters 31 through 38 are for storing coefficients of a divisor Ri−1(X). As the resisters 21 through 28 store residues after completing the division, they are referred to as Ri resisters and the resisters 31 through 38 are referred to as Ri−1 resisters. Data ends D of the resisters 21 through 28 are supplied with data from switches 60 through 67.

Output data terminals D from the resisters 21 through 28 are supplied to adders 41 through 47 and a multiplier 72, respectively, and also to data ends D of the registers 31 through 38. Output data from the resisters 31 through 38 are supplied to multipliers 51 through 57 and an inverse element storing ROM 70, and also to the switches 60 through 67.

The switch 60 is provided with 0 and a syndrome coefficient S0 and under the control of control signals LDN1 and LDN2 which will be described later, the switch selects one of 0, syndrome coefficient S0, and output from the resister 31 and outputs it to the resister 21. Similarly, the switches 31 through 37 are provided with the outputs of the adders 41 through 47 and S1 through S7 at the front stage, respectively and selecting one of three inputs, output to the registers 22 through 28.

The inverse element storing ROM 70 outputs the inverse element of the output from the register 38 to an AND gate 71. The AND gate supplies the inverse element to a multiplier 72 at "H" of the signal QEN. The multiplier 72 multiplies the output from the register 28 by the inverse element and outputs a product as an output Q(X) and supplies it to the multipliers 51 through 57. The multipliers 51 through multiply the outputs from the registers 31 through 37 by the Q(X) and output products to the multipliers 41 through 47. The adders 41 through 47 add the outputs of the registers through 27 at the front stage and outputs of the multipliers 51 through 57 and supply total outputs to the switches 61 through 67.

Figure 8:
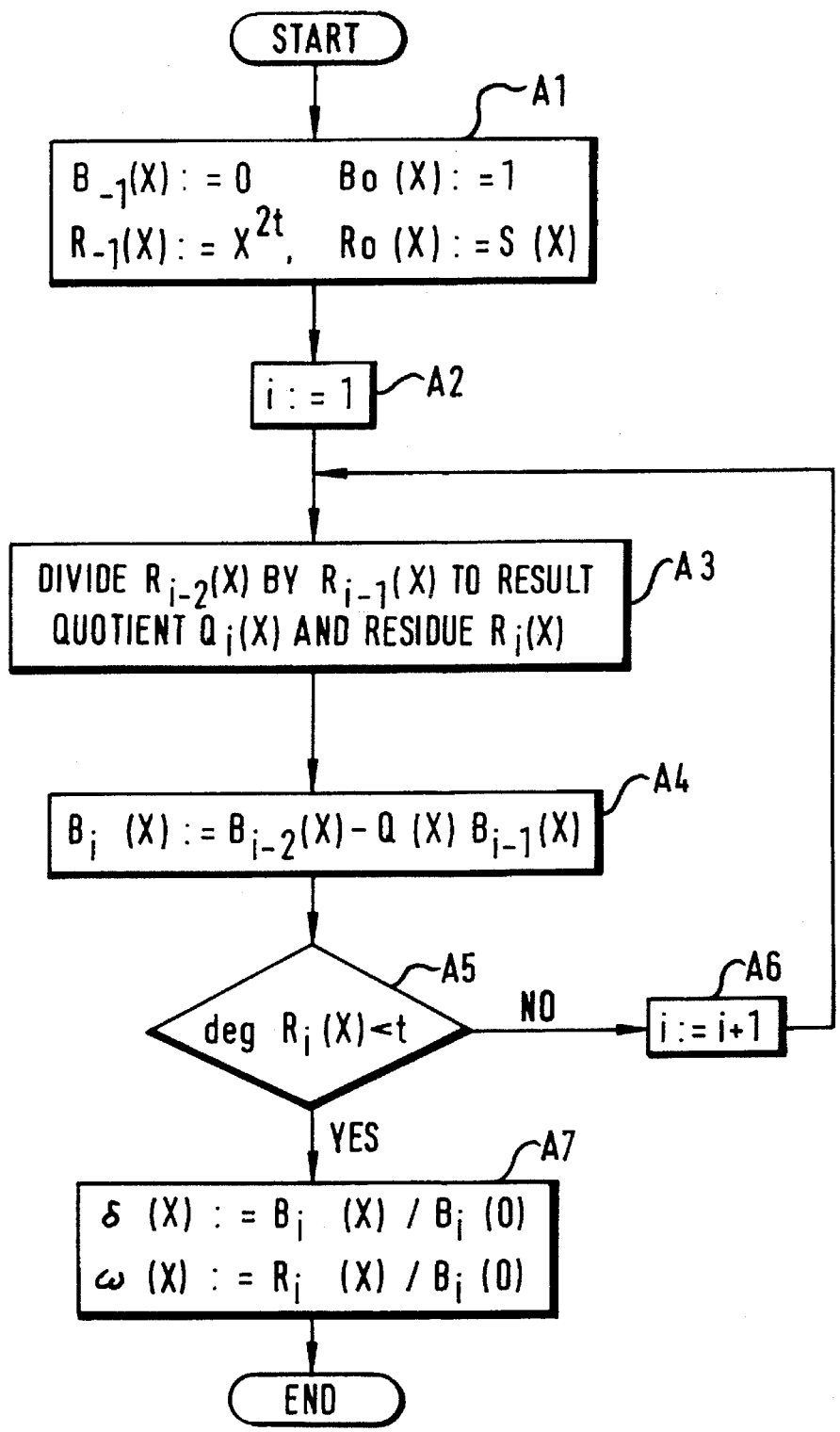
FIG. 8 is a flowchart for explaining the operation of the embodiment shown in FIG. 5.
Figure 9:
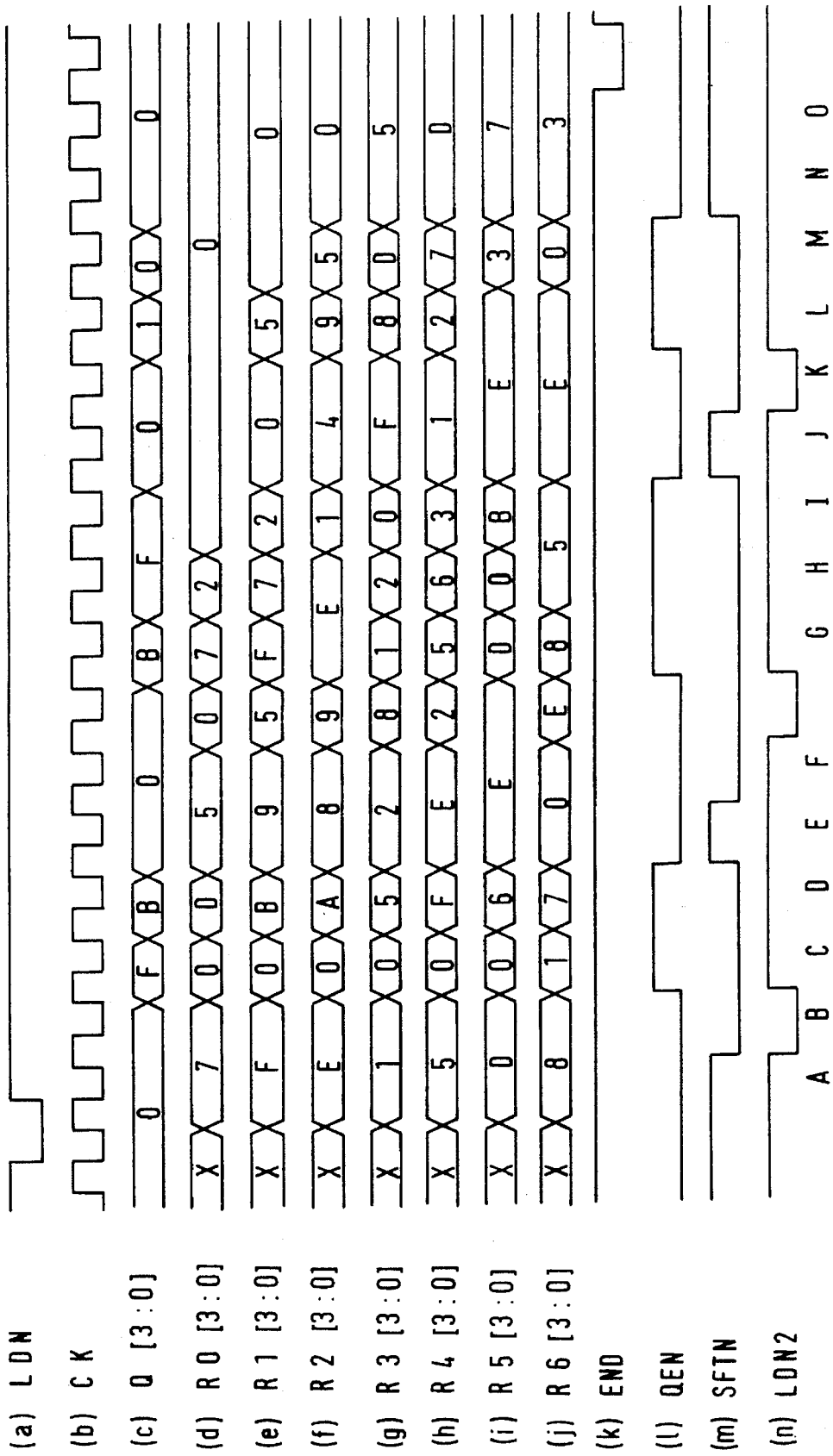
FIG. 9 is a timing chart for explaining the operation of the embodiment shown in FIG. 5.

Next, the operation of the circuit described above will be explained with reference to FIGS. 8 and 9. FIG. 8 is a flow-chart for explaining the Euclid's algorithm and it is discussed in "Code Theory", P. 172, by Hideki IMAI, compiled by Japan Electronic Information & Communication Institute). FIG. 9 is a timing chart for explaining the operation of the divider shown in FIG. 5.

As an example, a case for decoding (15, 7) RS codes on the Galois field GF($2^4$) will be explained. It is assumed that a primitive polynomial P(X) is to be P(X)=$X^4$+X+1 and a generator polynomial G(X) is expressed by the following equation (41):

$$G(X) = \Pi (x - \alpha^i) \quad (41)$$

It is further assumed that 15th datum from the last to the top datum of received signals are the 0th through 14th data and an error is generated on the 9th, 10th, 11th and 12th values. In this case, syndrome coefficients S0 through S7 are provided by the following equations (37) through (44).

$$S0 = \alpha^8 \cdot (\alpha^9) + \alpha \cdot (\alpha^{10}) + \alpha^6 \cdot (\alpha^{11}) + \alpha^9 \cdot (\alpha^{12}) = \alpha \quad (37)$$

$$S1 = \alpha^8 \cdot (\alpha^9)^2 + \alpha \cdot (\alpha^{10})^2 + \alpha^6 \cdot (\alpha^{11})^2 + \alpha^9 \cdot (\alpha^{12})^2 = \alpha^{10} \quad (38)$$

$$S2 = \alpha^8 \cdot (\alpha^9)^3 + \alpha \cdot (\alpha^{10})^3 + \alpha^6 \cdot (\alpha^{11})^3 + \alpha^9 \cdot (\alpha^{12})^3 = \alpha^{12} \quad (39)$$

$$S3 = \alpha^8 \cdot (\alpha^9)^4 + \alpha \cdot (\alpha^{10})^4 + \alpha^6 \cdot (\alpha^{11})^4 + \alpha^9 \cdot (\alpha^{12})^4 = \alpha^{11} \quad (40)$$

$$S4 = \alpha^8 \cdot (\alpha^9)^5 + \alpha \cdot (\alpha^{10})^5 + \alpha^6 \cdot (\alpha^{11})^5 + \alpha^9 \cdot (\alpha^{12})^5 = 1 \quad (41)$$

$$S5 = \alpha^8 \cdot (\alpha^9)^6 + \alpha \cdot (\alpha^{10})^6 + \alpha^6 \cdot (\alpha^{11})^6 \cdot (\alpha^{116} + \alpha^9 \cdot (\alpha^{12})^6 = \alpha^8 \quad (42)$$

$$S6 = \alpha^8 \cdot (\alpha^9)^7 + \alpha \cdot (\alpha^{10})^7 + \alpha^6 \cdot (\alpha^{11})^7 + \alpha^9 \cdot (\alpha^{12})^7 = \alpha^{13} \quad (43)$$

$$S7 = \alpha^8 \cdot (\alpha^9)^8 + \alpha \cdot (\alpha^{10})^8 + \alpha^6 \cdot (\alpha^{11})^8 + \alpha^9 \cdot (\alpha^{12})^8 = \alpha^3 \quad (44)$$

Therefore, it is possible to express a syndrome generator polynomial S(X) by the following equation (45).

$$S(X) = \alpha^3 \cdot X^7 + \alpha^{13} \cdot X^6 + \alpha^8 \cdot X^5 + X^4 + \alpha^{11} \cdot X^3 + \alpha^{12} \cdot X^2 + \alpha^{10} \cdot X + \alpha \quad (45)$$

Next, a calculation is performed based on the Euclid's algorithm shown in FIG. 8.

First, in the step A1 it is assumed that R−1(X)=$X^{2t}$=$X^8$, R0=S(X) B−1(X)=0 and B0=1.

Next, assuming i=1 in the step A2, the calculation is carried out according to the following equation (46) in the step A3.

$$Ri(X) = Ri-2(X) \cdot mod \, Ri-1(X) \quad (46)$$

where, Qi(X) is a quotient when Ri−2(X) was divided by Ri−1(X).

Then, the calculation is carried out according to the following equation (47) in the step A4:

$$Bi(X) = Bi-2(X) - Q(X) \cdot Ri-1(X) \quad (47)$$

The calculations by the equations (46) and (47) are carried out until deg Ri(X) becomes smaller than t (=4). When deg R(X)<4, the process moves from the step A5 to the step A6 and adding 1 to i, the steps A3 and A4 are repeated.

In this example, R1(X) will becomes as shown by the following equation (48) in the first loop.

$$\begin{aligned} R1(X) &= R-1(X) \div R0(X) = X^8 \div S(X) \\ &= \{(\alpha^{12} \cdot X + \alpha^7)/Q1(X)\} + \\ &\quad \{(\alpha^{11} \cdot X^5 + \alpha^{11} \cdot X^4 + \alpha \cdot X^3 + \\ &\quad \alpha^3 \cdot X^2 + \alpha^{14} \cdot X + \alpha^8)/R1(X)\} \end{aligned} \quad (48)$$

As deg R1(X)=5, R2(X) is obtained by incrementing i in the step A.

$$R2(X) = \{(\alpha^7 \cdot X^2 + \alpha^{12} \cdot X + \alpha^{12}/Q2(X)\} + \{(\alpha^{11} \cdot X^4 + \alpha^{11} \cdot X^3 + X^2 + \alpha^{12} \cdot X^2)/R2(X)\} \quad (49)$$

As deg R2(X)=4, R3(X) is obtained by incrementing i again in the step A4.

$$R3(X) = R1(X) \div R2(X) = \{(X)/Q3(X)\} + \{(\alpha^4 \cdot X + \alpha^{10} \cdot X^2 + \alpha^{13} \cdot X + \alpha^8)/R3(X)\} \quad (50)$$

As deg 3(X)=3, the calculation of the equation (50) is completed and the process moves from the step A5 to the step A7. R3(X) in the equation (50) is ω (X). Similarly, B1(X) through B3(X) at this time are obtained as follows.

$$\begin{aligned} B1(X) &= B-1(X) - Q1(X) \cdot B0(X) \\ &= 0 - Q1(X) \cdot 1 \\ &= Q1(X) = (\alpha^{12} \cdot X + \alpha^7) \end{aligned} \quad (51)$$

$$\begin{aligned} B2(X) &= B0(X) - Q2(X) \cdot B1(X) \\ &= 1 - Q2(X) \cdot B1(X) \\ &= 1 - (\alpha^7 \cdot X^2 + \alpha^{12} \cdot X + \alpha^{12}) \\ &= \alpha^4 \cdot X^3 + \alpha^4 \cdot X^2 + \alpha^{14} \cdot X + \alpha \end{aligned} \quad (52)$$

$$B3(X) = B1(X) - Q3(X) \cdot B2(X) \quad (53)$$
$$= (\alpha^{12} \cdot X + \alpha^7) -$$
$$X \cdot (\alpha 4 \cdot X^3 + \alpha^4 \cdot X^2 + \alpha^{14} \cdot X + \alpha)$$
$$= \alpha^4 \cdot X^4 + \alpha^4 \cdot X^3 + \alpha^{14} \cdot X^2 + \alpha^{13} \cdot X + \alpha^7$$

B3(X) in the equation (53) is σ (X).

Here, when $\alpha^{-12}$ is substituted into σ (X), the following equation (54) is obtained:

$$\sigma(\alpha^3) = \alpha^4 \cdot \alpha^{12} + \alpha^4 \cdot \alpha^9 + \alpha^{14} \cdot \alpha^6 + \alpha^{13} \cdot \alpha^3 + \alpha^7 = 0 \quad (54)$$

From this equation (54), it is known that an error was generated on the 12th value. An error value e at this time can be expressed by the following equation (55) using a derivative σ' (X)=$\alpha^4 \cdot X^2 + \alpha^{13}$, that was obtained by collecting odd terms of σ (X).

$$e = \omega(X) \div \sigma'(X) \quad (55)$$

As $X = \alpha^{-12} = \alpha^3$, when $\alpha^{-12}$ is substituted into the equation (55), the following equation (56) is obtained.

$$e = \omega(\alpha^3) \div \sigma'(\alpha^3) \quad (56)$$
$$= (\alpha^4 \cdot \alpha^9 + \alpha^{10} \cdot \alpha^6 + \alpha^{13} \cdot \alpha^3 + \alpha^8) \div (\alpha^4 \cdot \alpha^6 + \alpha^{13})$$
$$= \alpha^3 \div \alpha^9 = \alpha^9$$

thus, an error value $\alpha^9$ is thus obtained.

Similarly, substitute $\alpha^{-11}$, $\alpha^{-10}$ and $\alpha^{-9}$ into the equations (54) and (55).

As $X = \alpha^{-11} = \alpha^4$, the equation (54) will be calculated as the following equation (57).

$$\sigma(\alpha^4) = \alpha^4 \cdot \alpha^{16} + \alpha^4 \cdot \alpha^{12} + \alpha^{14} \cdot \alpha^8 + \alpha^{13} \cdot \alpha^4 + \alpha^7 = 0 \quad (57)$$

Further, a following result is obtained from the equation (55).

$$e = \omega(\alpha^4) \div \sigma'(\alpha^4) \quad (58)$$
$$= (\alpha^4 \cdot \alpha^{12} + \alpha^{10} \cdot \alpha^8 + \alpha^{13} \cdot \alpha^4 + \alpha^8) \div$$
$$(\alpha^4 \cdot \alpha^8 + \alpha^{13}) = \alpha^6$$

Further, as $X = \alpha^{-12} = \alpha^5$, the equations (54) and (55) will become as follows.

$$\sigma(\alpha^5) = \alpha^4 \cdot \alpha^{20} + \alpha^4 \cdot \alpha^{15} + \alpha^{14} \cdot \alpha^{10} + \alpha^{13} \cdot \alpha^5 \alpha^7 = 0 \quad (59)$$

$$e = \omega(\alpha^5) \div \sigma'(\alpha^5) = \alpha \quad (60)$$

Further, as $X = \alpha^{-9} = \alpha^6$, the following equations (61) and (62) are obtained.

$$\sigma(\alpha^6) = \alpha^4 \cdot \alpha^{24} + \alpha^4 \cdot \alpha^{18} + \alpha^{14} \cdot \alpha^{12} + \alpha^{13} \cdot \alpha^6 + \alpha^7 = 0 \quad (61)$$

$$e = \omega(\alpha^6) \div \sigma'(\alpha^6) = \alpha^8 \quad (62)$$

An error location and an error value are thus obtained.

The divider used in this embodiment is to obtain an quotient Q(X) and ω(X) of Ri(X)=Ri–2(X) mod Ri–1(X) in the equations (44) and (45) described above.

First, S(X) is stored in the Ri register and X8 in the Ri–1 register by a control signal LDN (FIG. 9(a)) during the period A shown in FIG. 9. In this case, it is determined whether the degree of R1 resister is Ri(X)<t (=4). As $S(X) = \alpha^3 \cdot X^7 + \alpha^{13} \cdot X^6 + \alpha^8 \cdot X^5 + X^4 + \alpha^{11} \cdot X^3 + \alpha^{12} \cdot X^2 + \alpha$ and degree is 7 in this embodiment, the next process is carried out.

Next, during the period B shown in FIG. 9, the shift is made until the maximum degree coefficient of the Ri register becomes other than 0. In the case shown in FIG. 9, no shift is made as the maximum degree coefficient of the R6 is $\alpha^3$(=8(HEX)).

In the next period C, the contents of the Ri register and the Ri–1 register are exchanged each other a the control signal LDN2. At this time, the calculation of $X^8 \div S(X)$ is started to obtain the maximum degree $\alpha^{12}$ (=F(HEX)) for Q(X). As a result, the signal showing a period when Q(X) is effective becomes "H". As a distance of degrees is 1 as described above, the division is completed in two clocks. During the next period D, a coefficient $\alpha^7$ (=B(HEX)) is obtained for Q(X). The division process is completed at this point of time and the signal QEN becomes "L".

In the period E shown in FIG. 9, coefficients of residue polynomials are stored in the Ri resister. That is, the outputs from the resisters 21 through 28 are R6=0, R5=$\alpha^{11}$, R4=$\alpha^{11}$, R3=α, R2=$\alpha^3$, R1=$\alpha^{14}$, R0=$\alpha^8$ made by the same operation as in the period A. The degree in this case is 5 and therefore, the process moves to the next operation and thereafter, the processes in the periods A through D will be repeated.

In the period F, the same operation as in the period B is carried out and the shift is continuously made until the maximum degree coefficient of the Ri resister becomes other than 0. Because R6 is 0, the shift is made only one time.

In the period G, the same operation as in the period C is carried out, the contents of the Ri resister and the Ri–1 are exchanged each other by the control signal LDN2 and the division process is started to get the maximum degree $\alpha^7$ (=B(HEX)) for Q(X). As a distance of degrees becomes 2 by one shift in the period F, the signal QEN becomes active for three clocks. The signal QEN is extended by the shift for the period F and the degree after calculation will be lowered by the shift.

The period H is a division process period and $\alpha^{12}$(= F(HEX)) is obtained for Q(X). In the period I, the same process as in the period D is carried out and 2(=F(HEX)) is output for Q(X). The division process is completed in the period I and the signal QEN becomes "L".

In the period J, the same operation as in the period E is carried out and residue polynomial coefficients are stored in the Ri resister. That is, they are R6=$\alpha^{11}$, R5=$\alpha^{11}$, R4=1, R3=$\alpha^{12}$, R2=$\alpha^2$, R1=0, R0=0. Here degree 4 is obtained through the degree judgement. As the degree is not less than 4, the process is continued.

In the next period K, no shift is made as R6=$\alpha^{11}$. In the period L, the contents of the Ri resister and the Ri–1 resister are exchanged by the control signal LDN2, the division process is started and the maximum degree $\alpha^0$ (=1(EEX)) is obtained for Q(X).

In the period M, the division process is completed and degree 0 of Q(X) is output. In the period N, residue polynomial coefficients, R6=$\alpha^4$, R5=$\alpha^{10}$, R4=$\alpha^{13}$, R3=$\alpha^8$, R2=0, R1=0, R1=0 are stored in the Ri register. In the period ), the degree judgement is carried out. As degree 3 is obtained by this degree judgement, the process is terminated.

Thus, the contents of the registers are exchanged for every division process and the division process is carried out by polynomial coefficient. It is, therefore, possible to improve the error correction process speed by reducing the processing time in the Euclid's algorithm operation. Further, as the real time operation is possible without requiring a buffer memory, this embodiment is effective for a digital VCR and the like which are used for high speed data transfer.

In this embodiment it is possible to construct the basic circuit (shown by the broken line in FIG. 5) using about 500 gates on the Galois field GF($2^8$) and in addition, it is also possible to construct an inverse element storing ROM using about 500 gates. It is only required to provide 2t pieces of the basic circuit portion and one piece of an inverse element storing ROM. And therefore, in the case of 2t=10, a circuit scale of about 5,500 gates is sufficient and in the case of 2t=16, a circuit can be constructed using about 85,000 gates. It is, therefore, possible to make the circuit scale smaller than in the prior art. Further, it is clear that the circuit scale can be easily expanded for a weighted error correction only by cascade coupling the basic circuits.

As described above, according to the present invention, it has the result that the circuit scale can be reduced without impairing the high speed processing capability.

Figure 10:
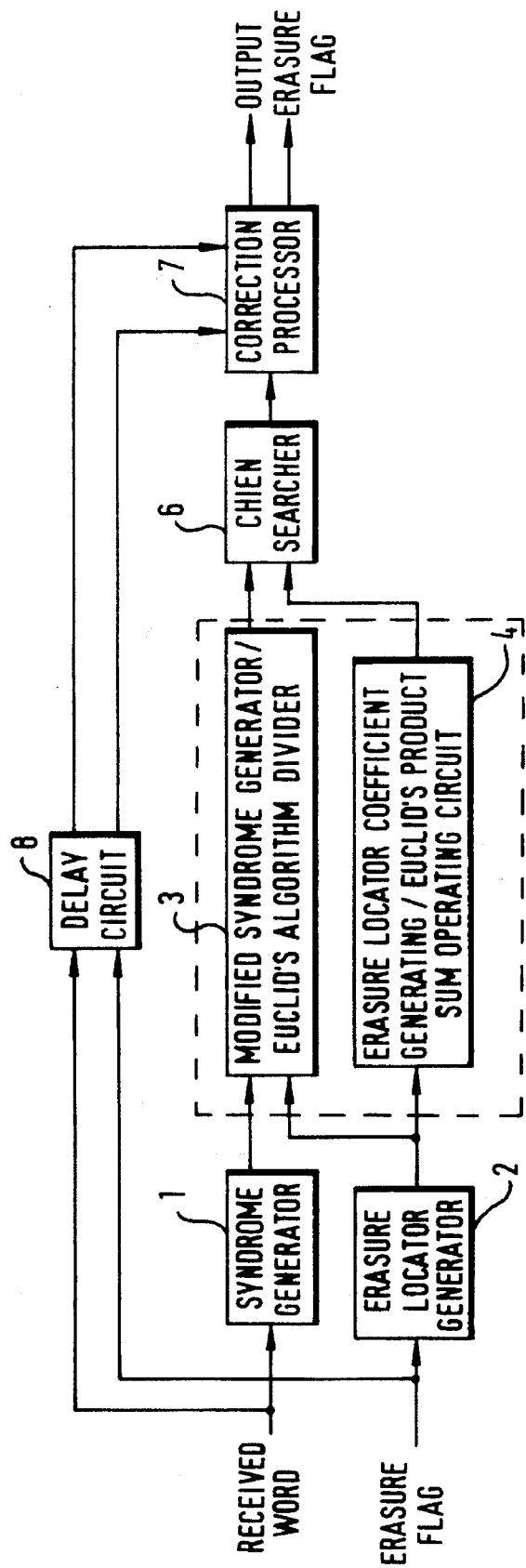
FIG. 10 is a block diagram showing one embodiment of the decoder according to a second embodiment of the present invention.

Next, a second embodiment of the decoder according to the present invention using the Euclid's algorithm operation circuit will be described. FIG. 10 is a block diagram showing a second embodiment of the decoder according to the present invention.

A received code-word is input to a syndrome generator 1. An erasure locator flag synchronizing with the received code-word is input to an erasure locator generator 2. The syndrome generator 1 calculates a syndrome S(X) from the received code-word. On the other hand, the erasure locator generator 2 generates an erasure locator coefficient $\alpha^i$ from the input erasure locator flag and stores it in a register (not shown).

In this embodiment, circuits for the modified syndrome generating operation and the erasure locator polynomial generating operation are used jointly with a divider and a product sum operation for the Euclid's algorithm operation, respectively. That is, the syndrome S(X) from the syndrome generator 1 and the erasure locator coefficient $\alpha^i$ from the erasure locator generator are supplied to the modified syndrome generating/the Euclid's algorithm divider 3. Further, the erasure locator coefficient $\alpha^i$ is supplied to the erasure locator polynomial generating Euclid's product sum operating circuit 4.

Figure 11:
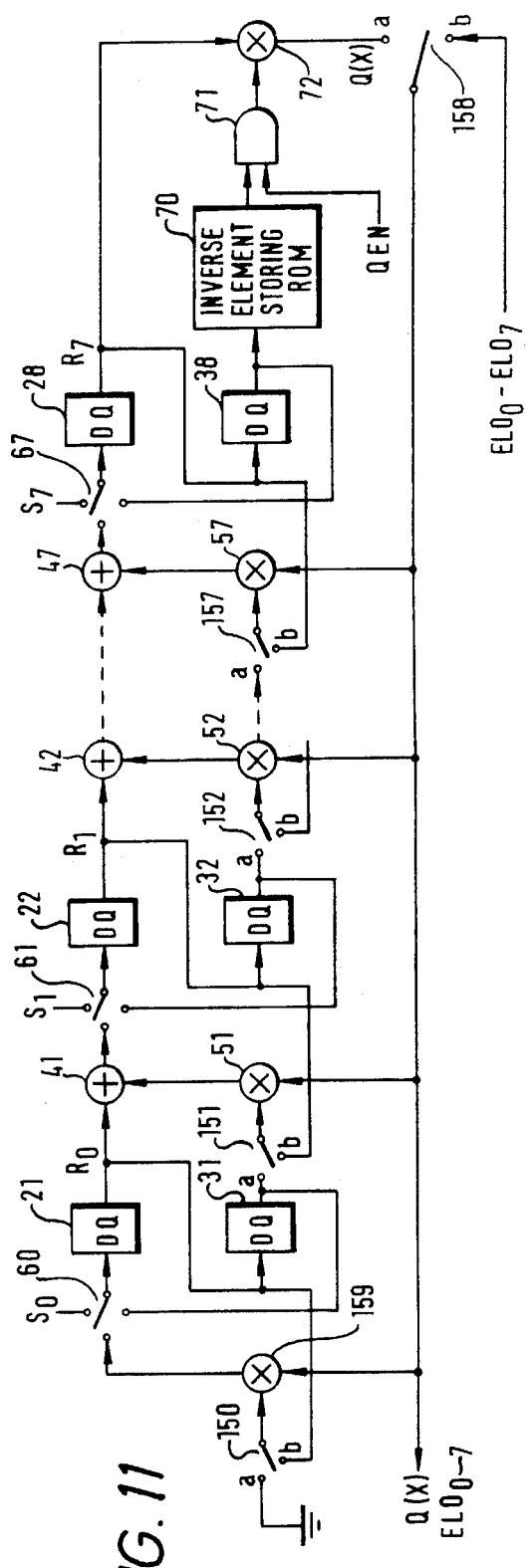
FIG. 11 is a circuit diagram showing a specified circuit arrangement of a modified syndrome generating/Euclid's algorithm divider 3 in FIG. 10.

FIG. 11 is a circuit diagram showing a specified circuit arrangement of the modified syndrome generating/Euclid's algorithm divider 3 shown in FIG. 10. Before explaining FIG. 11, a circuit for the principle of modified syndrome generation and the divider for Euclid's algorithm operation will be described with reference to FIGS. 12 and 13.

Figure 12:
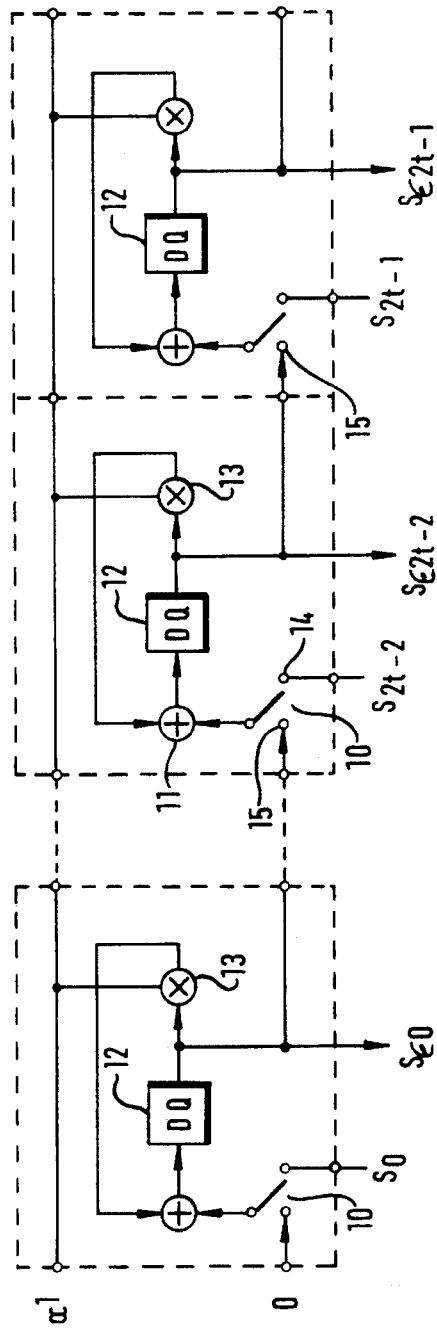
FIG. 12 is a block diagram showing the principle circuit for performing the modified syndrome generating operation in FIG. 10.

The circuit shown in FIG. 12 is constructed by connecting 2t of a cell comprising a switch 10, an adder 11, a register 12 and a multiplier 13. In the initialized state, the switch 10 selects a terminal 14 and supplies syndromes S0 through S2t−1 to respective registers. Then, the switch 10 selects a terminal 15 and supplies the output from the register 12 at the front stage to the adder 11. Further, 0 is input to the switch 10 of a cell at the lowest degree side. The added 11 has been supplied with a result of multiplication of the output from the resister 12 with the erasure locator coefficient $\alpha^i$, and the adder 11 performs the addition of mod $X^{2t}$. After all, as the detected erasure locator coefficient $\alpha^i$ is input, coefficients of the modified syndrome S(X) shown in the equation (39) are stored in the resister 12.

Next, with reference to FIG. 13, a divider that is usable for division in the Euclid's algorithm operation will be described. (The divider shown in FIG. 13 is that which was described in the specification (TOKU-GAN-HEI) 5-74652, filed previously by the same applicant for this application).

Registers 21 through 28 are for storing coefficients of a dividend Ri−2(X), while resisters 31 through 38 are for storing coefficients of a divisor Ri−1(X). As the registers 21 through 28 store residues after completing the division, these registers are referred to as Ri resisters and the resisters 31 through 38 are referred to as Ri−1 registers.

Figure 13:
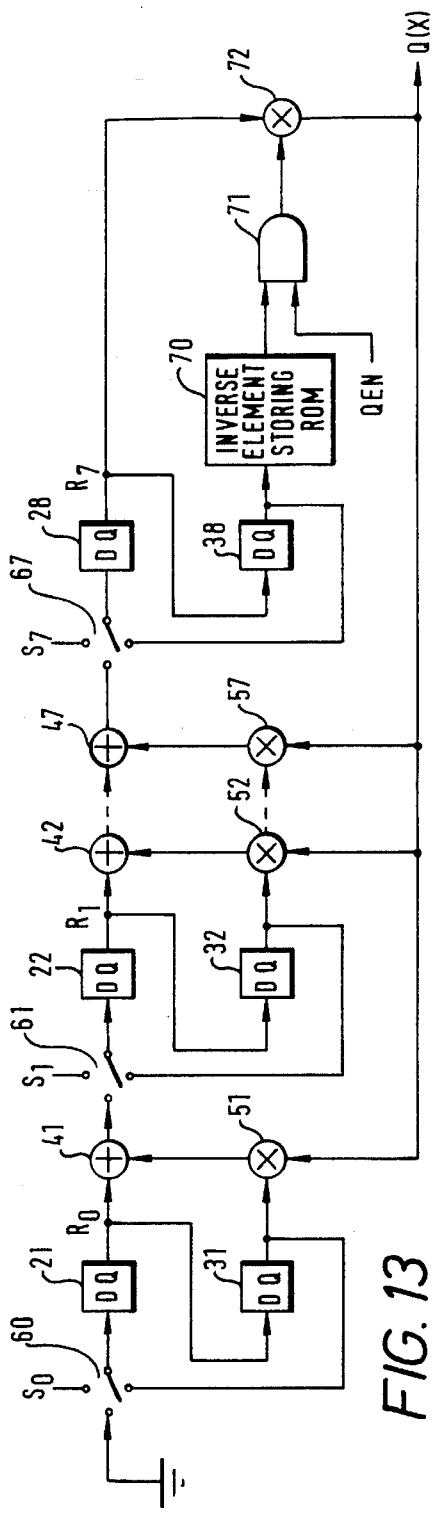
FIG. 13 is a circuit diagram showing a divider for Euclid's algorithm in FIG. 10.

If R−1(X)=X2t and R0=Sε(X), the calculation of the following equation (63) is carried out according to the circuit arrangement shown in FIG. 13.

$$Ri(X)=Ri-2(X) \bmod Ri-1 \qquad (63)$$

where, Qi(X) is a quotient when Ri−2 was divided by Ri−1(X). In FIG. 11, the Ri registers 21 through 28 and the Ri−1 registers 31 through 38 are in the same circuit arrangement as in FIG. 11. Data terminals D of the resisters 21 through 28 are supplied with data from switches 60 through 67, respectively. Output data from the resisters 21 through 28 are supplied to adders 41 through 47 and a multiplier 72, respectively and also, to the data terminals D of the registers 31 through 38. Output data from the registers 31 through 37 are supplied to multipliers 51 through 57 via switches 151 through 157, respectively, and also output of a multiplier 38 is supplied to an inverse element storing ROM. Further, output data from the resisters 31 through 38 are also supplied to the switches 60 through 67.

The switch 60 is supplied with 0 and syndrome coefficient S0 and under the control of control signals LDN1 and LDN2 that are described later, selects one of 0, the syndrome coefficient S0 and the output of the resister 31 and supplies it to the resister 21. Similarly, the switches 31 through 67 are supplied with the outputs of the adders 41 through 47 at the front stage and S1 through S7 and selecting one of three inputs, output to the resisters 22 through 28.

The inverse element storing ROM 70 outputs an inverse element of the output of the resister 38 to an AND gate 71. The AND gate 71 supplies the inverse element to the multiplier 72 at "H" level of the signal QEN. The multiplier 72 multiplies the output of the resister 28 by the inverse element and outputs a product as an output Q(X) and also, supplies it to the multipliers 51 through 57. The multipliers 51 through 57 multiply the outputs of the resisters 31 through 37 by the Q(X) and output products to the adder 41 through 47. The adders 41 through 47 add up the output from the resisters 21 through 27 at the front stage with the outputs from the multipliers 51 through 57 and supply the added outputs to the switches 61 through 67, respectively.

In this embodiment, switches 150 through 157 and 158 for selecting the modified syndrome calculation process or Euclid's division process and a multiplier 159 for supplying the output of the multiplier 72 to the switch 60 are provided. The switches 150 through 157 and 158 select a terminal b for performing the modified syndrome calculation and a terminal a for performing the division.

Figure 14:
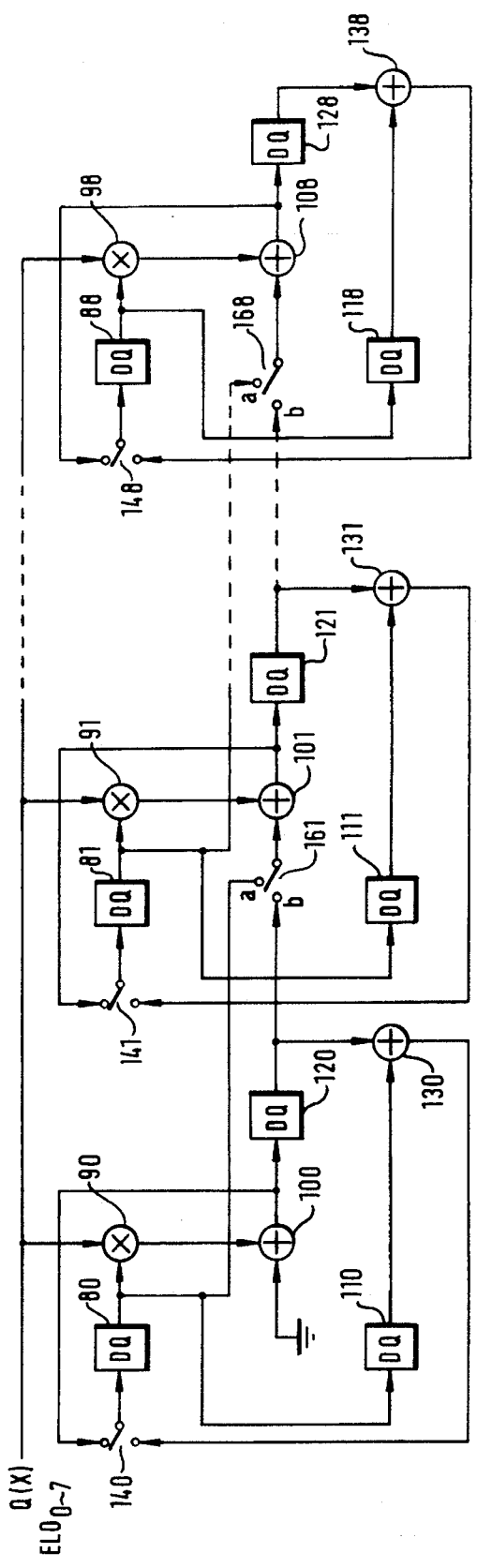
FIG. 14 is a circuit diagram showing the specified circuit arrangement of the erasure locator polynomial generating/ product sum operating circuit for Euclid's algorithm 4 in FIG. 10.

FIG. 14 is circuit diagram showing a specified circuit arrangement of the erasure locator polynomial generating/ Euclid's product sum operation circuit 4 shown in FIG. 10. Before explaining this FIG. 14, the erasure locator polynomial generating principle circuit and the Euclid's algorithm product sum operator will be described with reference to FIGS. 15 and 16.

Figure 15:
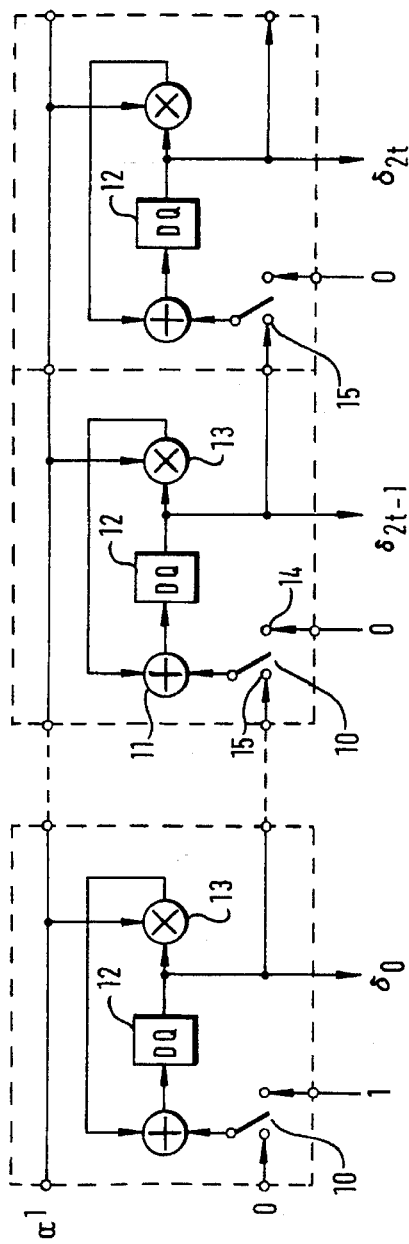
FIG. 15 is a block diagram showing the principle circuit for performing the erasure locator polynomial generating operation in FIG. 10.

The circuit arrangement shown in FIG. 15 is the same as that of the modified syndrome generating principle circuit shown in FIG. 12. In FIG. 15, t2+1 cells are connected and 1, 0, 0, . . . are input to a terminal 14 of a switch 10. In the initialized state, the switch 10 selects the terminal 14 and thereafter, selects a terminal 15 to input the output of the front stage cell. If erasure locator coefficients are $\alpha^i$, $\alpha^j$, $\alpha^k$, . . . , a coefficient of an erasure locator polynomial σε(X) shown in the following equation (64) is obtained:

$$\sigma_\epsilon(X)=(X-\alpha^i)\cdot(X-\alpha^j)\cdot(X-\alpha^k)\ldots \qquad (64)$$

Next, a product sum operator that is usable for the product sum operation of the Euclid's algorithm will be explained with reference to FIG. 16.

In registers 80 through 88, Bi(X) is stored and multipliers 90 through 98 output results of multiplication of outputs of the registers 80 through 88 with a quotient Q(X) of the divider shown in FIG. 13 to adders 100 through 108. The outputs of the adders 100 through 108 are supplied to QBi registers 120 through 128, respectively. Adders 130 through 138 are supplied with the outputs from Bi–2 registers 110 through 118, which are storing outputs from the resisters 80 through 88, and add two inputs.

Figure 16:
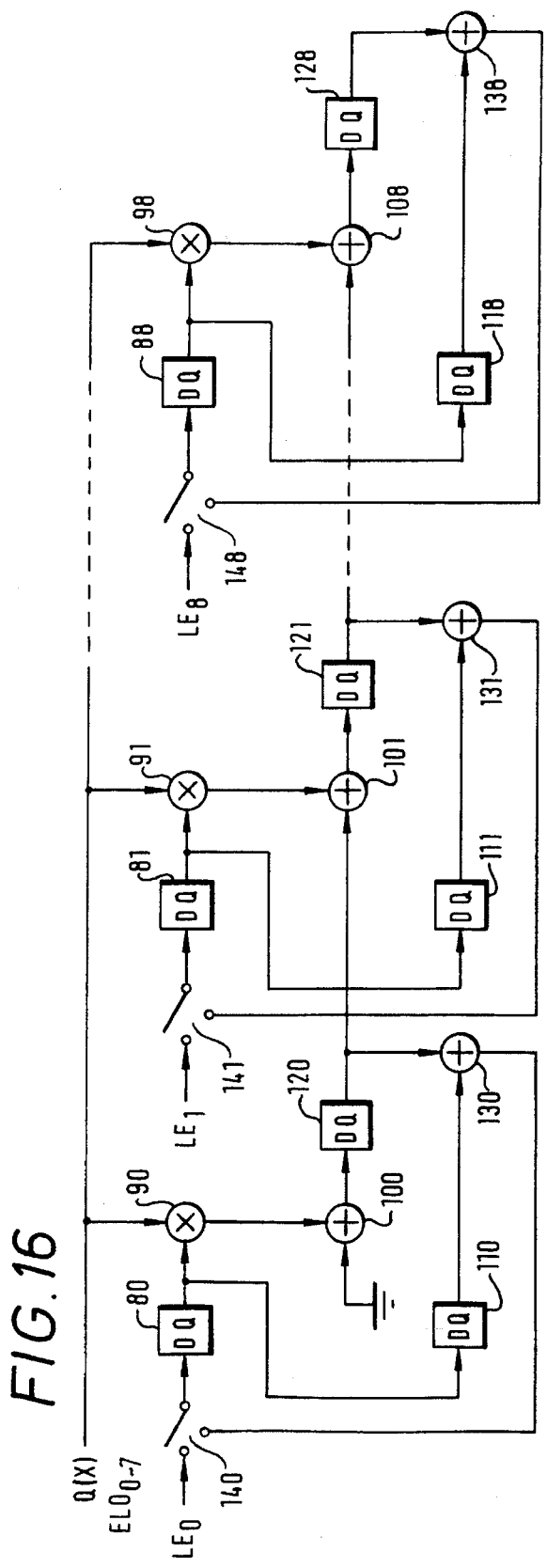
FIG. 16 is a circuit diagram showing the product sum operating circuit for Euclid's algorithm in FIG. 10.

If B–1(X)=0 and B0=Sε(X), the product sum operator shown in FIG. 16 carries out the product sum operation of the following equation (65).

$$Bi(X) = Bi-2(X) - Qi(X) \cdot Ri-1(X) \tag{65}$$

Further, the operations of the equations (64) and (65) are carried out until deg Ri(X) becomes less than [(2t+Nε)/2] (N is the number of erasures (the number of erasure locator flags)).

In FIG. 14, outputs from switches 140 through 148 are input to data terminals D of the Bi resisters 80 through 88. The outputs from the resisters 80 through 88 are supplied to the multipliers 90 through 98, respectively, and also to data terminals D of the Bi–2 resisters 110 through 118. Further, the outputs of the resisters 80 through 87 supplied to the adders 101 through 108 via switches 161 through 168. The multipliers 90 through 98 are supplied with Q(X) and by multiplying the outputs of the Bi resisters 80 through 88 by Q(X), output results of the multiplication to the adders 100 through 108, respectively. The outputs from the adders 100 through 108 are supplied to the QBi resisters 120 through 128, respectively, and the adders 100 through 108 add the outputs from the multipliers 90 through 98 and 0 or the outputs from the switches 161 through 168 and output the result. The outputs from the QBi resisters 120 through 128 are supplied to the adders 130 through 138, which in turn add the outputs from the resisters 120 through 128 and those from the resisters 110 through 118 and supply the added outputs to switches 140 through 148.

In this embodiment, switches 161 through 168 are provided for selecting the erasure locator polynomial generating operation or the Euclid's product sum operation. The switches 161 through 168 select the terminal a for the erasure locator polynomial generation and the terminal b for the Euclid's product sum operation.

The erasure locator polynomial generating/Euclid's product sum operating circuit 4 obtains an erasure locator polynomial Sε(X) of the equation (64) from erasure locator coefficients $\alpha^i, \alpha^j, \alpha^k, \ldots$, and at the same time, the modified syndrome generating/Euclid's divider 3 obtains the modified syndrome shown in the equation (1) from the syndrome S(X) and erasure locator coefficients $\alpha^i, \alpha^j, \alpha^k, \ldots$. The Euclid's algorithm operation is carried out with the results of the operation used as initial values. That is, the modified syndrome generating/Euclid's divider 3 obtains an error value polynomial ω (X) according to the equation (65) with the modified syndrome Sε (X) coefficient used as an initial value, while the erasure locator polynomial generating/Euclid's product sum operating circuit 4 obtains an error value polynomial ω (X) according to the equation (56) with the erasure locator polynomial σ(X) used as an initial value.

The error value polynomial ω(X) and the error locator polynomial a (X) are supplied to the Chien searcher 6. The Chien searcher 6 obtains a differentiated value σ'(X) of the error locator polynomial σ(X) and obtains an error value $\omega(\alpha^i)/\sigma'(\alpha^i)$ through the calculation at a location i where the error locator polynomial $\sigma(\alpha^i)$ becomes 0. These error locations and error values are supplied to the correction processor 7. A received code-word and an erasure locator flag are also supplied to the delay circuit 8, and the delay circuit 8 supplies the received code-word and the erasure locator flag to the correction processor 7 by delaying them taking the delay of the processing time up to the Chien searcher 7 into consideration. The correction processor 7 corrects an error, if nay, of the received code-word by making the Galois field addition of the received code-word and an error value at an error location nd outputs the corrected received code-word.

Figure 17:
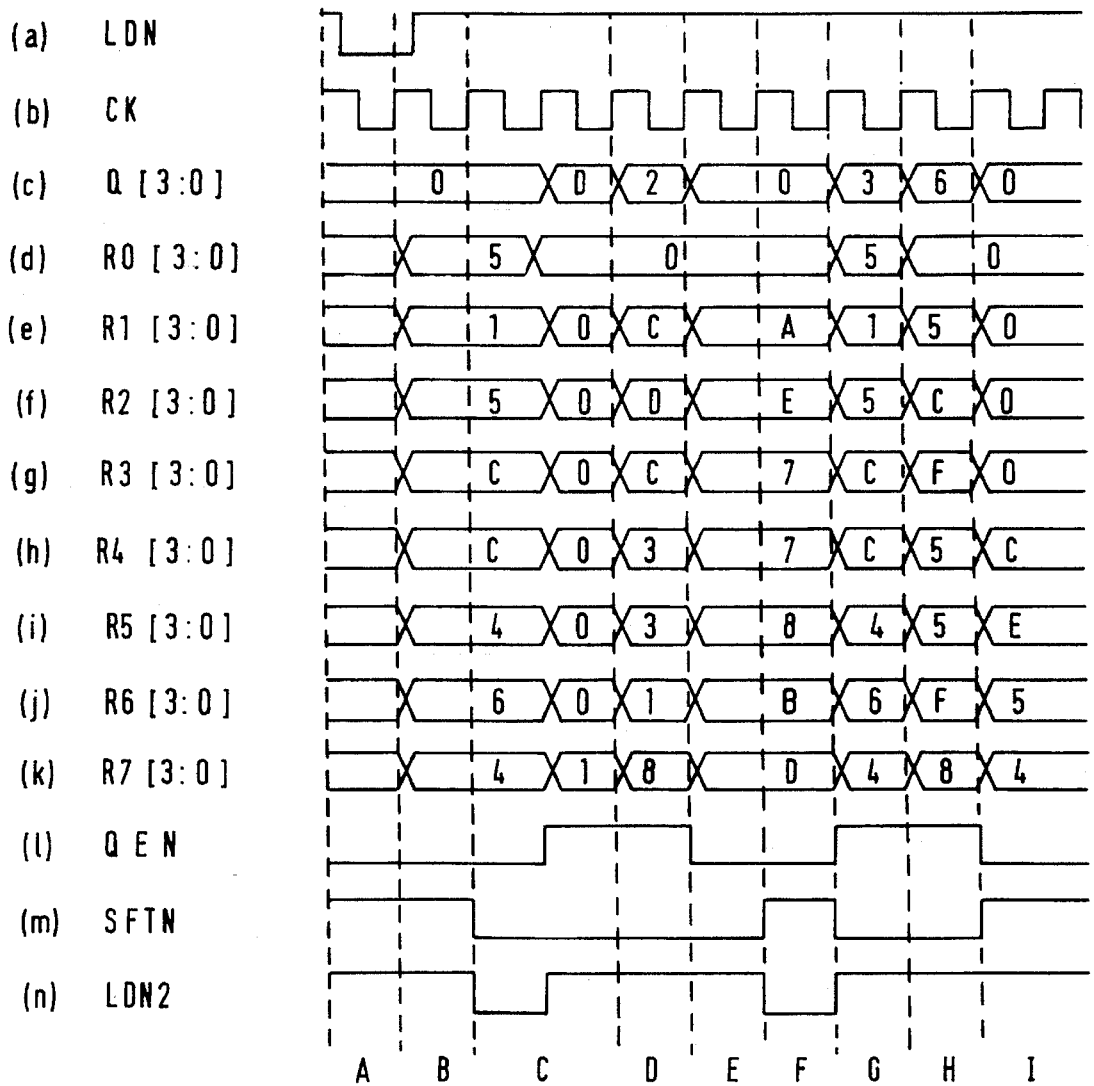
FIG. 17 is a timing chart for explaining the operation in FIG. 13.
Figure 18:
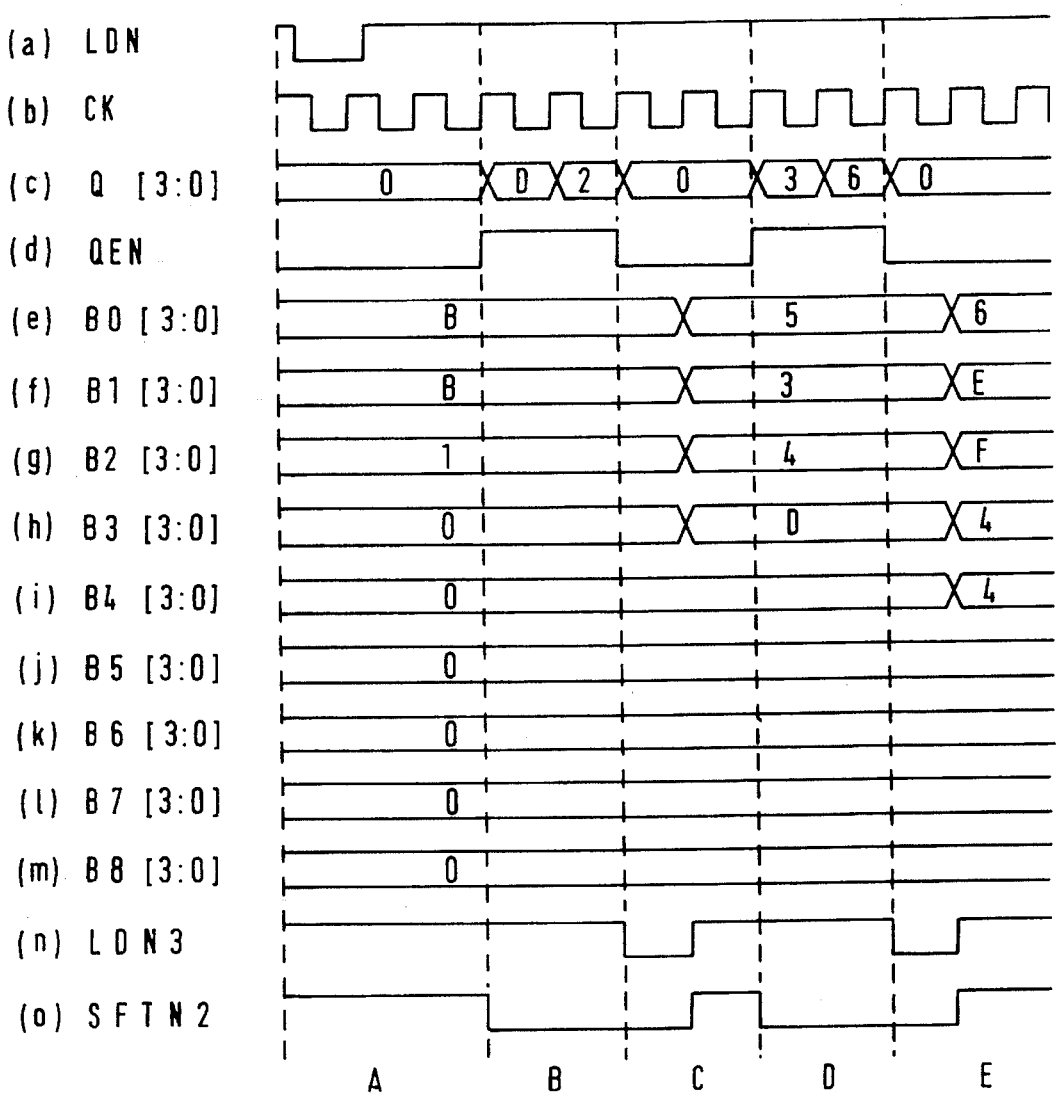
FIG. 18 is a timing chart for explaining the operation in FIG. 16.

Next, the operation of the embodiment in the circuit arrangement as described above will be explained with reference to the timing charts shown in FIGS. 17 and 18 and the explanatory diagram in FIGS. 19 through 22. FIG. 17 is a timing chart for explaining the operation of the divider shown in FIG. 13 and FIG. 18 is a timing chart for explaining the operation of the product sum operating circuit.

In this embodiment, the modified syndrome generation and Euclid's division as well as the erasure locator polynomial generation and Euclid's product sum operation have been realized by the circuits shown in FIGS. 11 and 14, respectively. However, for convenience of explanation, it is first explained that these operations are realized by the circuits shown in FIG. 12 through 16, and then it will be explained that the circuit operations in FIGS. 12 through 16 are realized by the circuits shown in FIGS. 11 and 14.

Likewise the Euclid's algorithm described in the first embodiment, when a case for decoding (15, 7) RS codes on the Galois field GF($2^4$) is taken as an example, the equation described above will hold goods if a primitive polynomial P(X) is assumed to be $X^4+X+1$.

Similarly, when assuming that 15th information-bearing symbols from the last to the top symbols of the received signal are to be 0th through 14th information-bearing symbols, if errors $\alpha^8$, $\alpha$, $\alpha 6$ and $\alpha^9$ are generated on the 9th, 10th, 11th and 12th symbols, syndrome coefficients S0 through S7 are given by the above equations (37) through (44).

Therefore, it is possible to express a syndrome generator polynomial S(X) by the equation (45) as described above.

On the other hand, when assuming that an erasure locator flag is generated on the 12th and 11th information-bearing symbols of a received code-word, a modified syndrome Sε(X) is obtained as shown by the following equation (66) through the calculation of the equation (34) by the circuit shown in FIG. 12.

$$\begin{aligned} S\epsilon(X) &= (X - \alpha^{-12}) \cdot (X - \alpha^{-11}) \cdot S(X) \bmod X^8 \\ &= \alpha^2 \cdot X^7 + \alpha^5 \cdot X^6 + \alpha^2 \cdot X^5 + \alpha^6 \cdot X^4 + \\ &\quad \alpha^6 \cdot X^3 + \alpha^8 \cdot X^2 + X + \alpha^8 \end{aligned} \tag{66}$$

Further, through the calculation of the equation (64) by the circuit shown in FIG. 15, an erasure locator polynomial σε(X) is obtained as expressed by the following equation (67).

$$\sigma\epsilon(X) = (X-\alpha^{-12}) \cdot (X-\alpha^{-11}) = X^2 + \alpha^7 \cdot X + \alpha^7 \tag{67}$$

First, it is assumed that R–1(X)=$X^{2t}$=$X^8$, R0=Sε(X), B–1(X)=0. B0=σε(X).

Next, assuming i=1, the calculation is carried out as to the above equation (63) according to the circuit of FIG. 13.

As described above, Qi(X) is the quotient when Ri–2(X) was divided by Ri–1(X).

This calculation is carried out until deg Ri(X) becomes smaller than (8+2)/2 (=5). When Ri(X) is smaller than 5 (Ri(X)<5), the calculation is repeated by every time incrementing the i by 1.

In this example, Ri(X) will be as shown by the following equation (68) in the first loop:

$$R1(X) = R-1(X) \div R0(X) = X^8 \div S\epsilon(X) \quad (68)$$
$$= \{(\alpha^{13} \cdot X + \alpha)/Q1(X)\} +$$
$$\{(\alpha^{131} \cdot X^6 + \alpha^7 \cdot X^5 + \alpha^3 \cdot X^4 + \alpha^{10} \cdot X^3 +$$
$$\alpha^{10} \cdot X^2 + \alpha^{11} \cdot X + \alpha^9)/R1(X)\}$$

As deg R1(X)=6, the calculation is repeated by every time incrementing the i by 1 so that R2(X) is obtained from the following equation (69).

$$R2(X) = R0(X) \div R1(X) = \{(\alpha^4 \cdot X + \alpha^5)/Q2(X)\} + \{(\alpha^2 \cdot X^3 + \alpha^8 \cdot X^2 + \alpha^{11} \cdot X + \alpha^6)/R2(X)\} \quad (69)$$

As deg R3(X)=3, the calculation of the above equation is terminated. Here, in the above equation R3(X) equals to ω(X).

On the other hand, the circuit of FIG. 16 carries out the calculation of the equation (64) until deg Ri(X) becomes smaller than 5 (deg Ri(X)<5).

Thus, following equations (70) and (71) are obtained.

$$B1(X) = B-1(X) - Q1(X) \cdot B0(X) \quad (70)$$
$$= 0 - (\alpha^{13} \cdot X + \alpha) \cdot (X^2 + \alpha^7 \cdot X + \alpha^7)$$
$$= \alpha^{13} \cdot X^3 + \alpha^2 \cdot X^2 + \alpha^4 \cdot X + \alpha^8$$

$$B2(X) = B0(X) - Q2(X) \cdot B1(X) \quad (71)$$
$$= (X^2 + \alpha^7 \cdot X + \alpha^7) - (\alpha^4 \cdot X + \alpha^5) \cdot$$
$$(\alpha^{13} \cdot X^3 + \alpha^2 \cdot X^2 + \alpha^4 \cdot X + \alpha^8)$$
$$= \alpha^2 \cdot X^4 + \alpha^2 \cdot X^3 + \alpha^{12} \cdot X^2 + \alpha^{11} \cdot X + \alpha^5$$

Here, the B2(X) in the equation (71) is equal to σ(X).

Here as $X = \alpha^{-12} = \alpha^3$, when $\alpha^{-12}$ is substituted into σ(X), the following equation (72) is obtained:

$$\sigma(\alpha 3)\alpha^2 \cdot \alpha^{12} + \alpha^2 \cdot \alpha^9 + \alpha^{12} \cdot \alpha^6 + \alpha^{11} \cdot \alpha^3 + \alpha^5 = \alpha^{14} + \alpha^{11} + \alpha^3 + \alpha^{14} + \alpha^5 = 0 \quad (72)$$

From the this equation (72), it is known that an error was generated on the 12th value. An error value e at this time can be expressed by the followings equation (73) using a derivative $\sigma'(X) = \alpha^2 \cdot X^2 + \alpha^{11}$, that was obtained by collecting odd terms of σ(X).

$$e = \omega(X) \div \sigma'(X) \quad (73)$$

As $X = \alpha^{-12} = \alpha^3$, when $\alpha^{-12}$ is substituted into the equation (73), the following equation (74) is established/

$$e = \omega(\alpha^3) \div \sigma'(\alpha^3) \quad (74)$$
$$= (\alpha^2 \cdot \alpha^9 + \alpha^8 \cdot \alpha^6 + \alpha^{11} \cdot \alpha^3 + \alpha^6) \div (\alpha^2 \cdot \alpha^6 + \alpha^{11})$$
$$= \alpha^1 \div \alpha^7 = \alpha^9$$

Thus, the error value $\alpha^9$ is obtained.

Similarly, substitute $\alpha^{-11}$, $\alpha^{-10}$ and $\alpha^{-9}$ into the equations (71) and (73) for calculating the 11th, 10th and 9th terms.

As $X = \alpha^{-11} = \alpha^4$, the following equation (75) is developed from the equation (71).

$$\sigma(\alpha^4) = \alpha^2 \cdot \alpha^{16} + \alpha^2 \cdot \alpha^{12} + \alpha^{12} \cdot \alpha^{11} \cdot \alpha^4 + \alpha^5 = \alpha^3 + \alpha^{14} + \alpha^5 \alpha^0 + \alpha^5 = 0 \quad (75)$$

Further, a following result (76) is obtained from the equation (73).

$$e = \omega(\alpha^4) \div \sigma'(\alpha^4) \quad (76)$$
$$= (\alpha^4 \cdot \alpha^4 + \alpha^5) \div (\alpha^2 \cdot \alpha^{12} + \alpha^8 \cdot \alpha^8 + \alpha^{11} \cdot \alpha^4 + \alpha^5)$$
$$= \alpha^6$$

Further, when $X = \alpha^{-10} = \alpha^5$ is substituted, the equations (71) and (73) will become as follows.

$$\sigma(\alpha^5) = \alpha^7 + \alpha^2 + \alpha^7 + \alpha^1 + \alpha^5 = 0 \quad (77)$$

$$e = \omega(\alpha^5) \div \sigma'(\alpha^5) = \alpha \quad (78)$$

Further, $X = \alpha^{-9} = \alpha^6$ is substituted, the following equations (79) and (80) are obtained.

$$\sigma(\alpha^6) = \alpha^{11} + \alpha^5 + \alpha^9 + \alpha^2 + \alpha^5 = 0 \quad (79)$$

$$e = \omega(\alpha^6) \div \sigma'(\alpha^6) = \alpha^8 \quad (80)$$

An error location and an error value are thus obtained.

Now, operations that the divider of FIG. 13 and the product sum operation circuit of FIG. 16 use carry out the above calculations will be described. The divider of FIG. 13 is used for obtaining the quotients Q(X) and ω(X) of the above equations (63).

First, Sε(X) is stored in the Ri register and X8 in the Ri-1 register by a control signal LDN (FIG. 17(a)) during the period A shown in FIG. 17. In this case, it is determined whether the deg Ri(X)<5. As $S\epsilon(X) = \alpha^2 \cdot X^7 + \alpha^2 \cdot X^6 + \alpha^2 \cdot X^5 + \alpha^6 \cdot X^4 + \alpha^6 \cdot X^3 + \alpha^8 \cdot X^2 + X + \alpha^8$ and degree is 7 in this embodiment, the next process is carried out.

Next, during the period B shown in FIG. 17, the shift is made until the maximum degree coefficient of the Ri register becomes other than 0. In the case shown in FIG. 17, no shift is made as the maximum degree coefficient of the R6 is $\alpha^3$ (=4(HEX)).

In the next period C, the contents of the Ri register and the Ri-1 register are exchanged by the control signal LDN2. At this time, the calculation of $X^8 \div S\epsilon(X)$ is started to obtain the maximum degree $\alpha^{13}$ (=D(HEX)) for Q(X). As a result, the signal QEN showing a period when Q(X) is effective becomes "H". As the distance of degrees is 1 as described above, the division is completed in two clocks. During the next period D, a coefficient $\alpha^2$(=2(HEX)) is obtained for Q(X). The division process is completed at this time and the signal QEN becomes "L" and SFTN becomes "H".

In the period E shown in FIG. 17, coefficients of residue polynomials are stored in the Ri register. That is, the outputs from the resisters 21 through 28 are $R7 = \alpha^{13}$, $R6 = \alpha^7$, $R4 = \alpha^{10}$, $R3 = \alpha^{10}$, $R2 = \alpha^{11}$, $R1 = \alpha^9$, $R0 = 0$ made by the same operation as in the period A. The degree in this case is 6 and therefore, the process moves to the next operation and thereafter, the processes in the periods A through D will be repeated.

In the period F, the same operation as in the period B is carried out and the shift is continuously made until the maximum degree coefficient of the Ri resister becomes other than 0. Because R6 is $\alpha^{13}$, the shift is not carried out In the period G, the same operation as in the period C is carried out, the contents of the Ri resister and the Ri-1 are exchanged by the control signal LDN2 and the division process is started to get the maximum degree $\alpha^4$(=3(HEX)) for Q(X). As the distance of degrees is 1, the signal QEN becomes active for two clocks.

The period H is a division process period and $\alpha^5$ (=6(HBX)) is obtained for Q(X). This division is terminated in the period H, then the QEN becomes "L". In the period I, the same process as in the period E is carried out and a coefficient of the the residue polynomial is stored in the Ri register. That is, R7=0, R6=0, R5=0, $R4 = \alpha^2$, $R3 = \alpha^3$, $R2 = \alpha^{11}$, $R1 = \alpha^6$ and R0=0. Then, when degree 3 is obtained by this degree judgement, the process is terminated.

On the other hand, the product sum operating circuit shown in FIG. 16 is used to obtain σ (X) from the equation (65).

The product sum operation is carried out whenever a quotient Q(X) is input from the divider shown in FIG. 13. In the period A shown in FIG. 18, the control signal LDN becomes "L" and the erasure locator polynomial coefficients are preset in the Bi register. The Bi–2 register and the QBi register are cleared. In this embodiment, preset values in the Bi register are $B2=\alpha^0$, $B1=\alpha^7$ and $B0=\alpha^7$ from the equation (65).

Then, in the period B shown in FIG. 18, coefficients of the quotient Q(X) are input sequentially from the higher coefficients. That is, they are input in order of $\alpha^{13}$, $\alpha$, and $X^2+\alpha^7$, $X+\alpha^7$ preset in the Bi register in the period A is multiplied by the quotient Q(X) and a product obtained is added to the contents 0 of the Bi–2 register. Here, as shown in FIG. 18(o), a signal SFTN2 to make the QBi register active becomes "L" and the QBi register only is operated. Data in the Bi register and the Bi–2 register are kept.

In the next period C, the control signal LDN3 becomes "L" to store the result of product sum operation in the Bi register and the contents 1 of the Bi register are transferred to the Bi–2 register for the next time calculation. Further, the QBi register is cleared. In this period C, the result of the first time product operation sum $(\alpha^-\cdot X^3+\alpha^2\cdot X^2+\alpha^4\cdot X+\alpha^8)$ is stored in the Bi register.

In the next period D, likewise the period B, coefficients of Q(X) are input sequentially from the higher coefficients. That is, they are input in order of $\alpha^4$, $\alpha^5$, and $(\alpha^{13}\cdot X^3+\alpha^2\cdot X^2+\alpha^4\cdot X+\alpha^8)$ reset in the Bi register in the period C is multiplied by Q(X) and added to $(X^2+\alpha^7\cdot X+\alpha^7)$ being stored in the Bi–2 register.

In the period E, likewise the period C, the control signal LDN3 becomes "h" and the following result Bi(X) of product sum operation is stored in the Bi register.

$$Bi(X)=\alpha^2\cdot X^4+\alpha^2\cdot X^3+\alpha^{12}\cdot X+\alpha^5=\sigma(X)$$

That is, the final result of product sum operation is kept stored in the Bi register.

Thus, the Euclid's algorithm operation is carried out. In the Euclid's algorithm division, modified syndrome coefficients are used as preset values. Further, in the product sum operation, erasure locator polynomial coefficients are used as preset values. So, in this embodiment, circuit scales have been reduced by designing common use of circuits paying attention to this point.

That is, the modified syndrome generating/Euclid's algorithm divider 3 is the divider shown in FIG. 13 with the switches 150 through 157 and 159 added and first, calculates modified syndromes from syndromes (S0 through S7) and erasure locator coefficients (ELO0 through ELO7) and then, generates an error value polynomial through the Euclid's algorithm division.

In a word, first, syndromes are loaded on the Ri register by the switches 60 through 67, and then selecting the outputs from the multiplier 159 and the adders 41 through 47 by the switches 60 through 67 and the terminals b are selected by the switches 150 through 157 and 159. Then, the circuit shown in FIG. 11 will become the circuit state shown by a thick line in FIG. 19.

Figure 19:
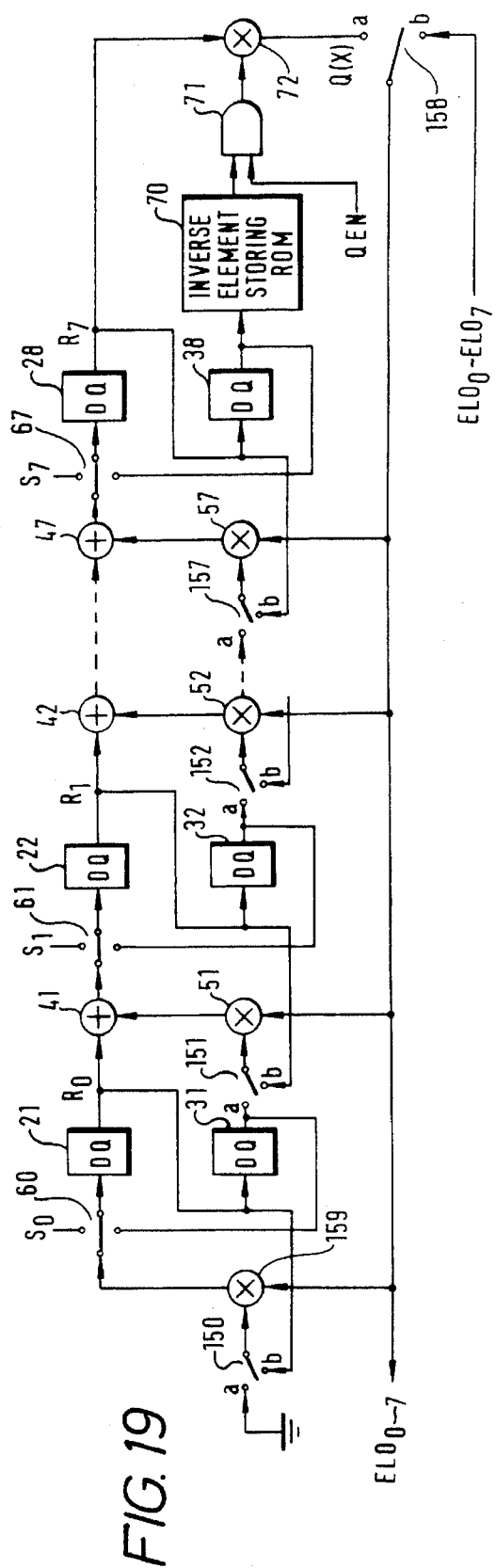
FIG. 19 is an explanatory diagram for explaining the operation of the embodiment shown in FIG. 10.
Figure 20:
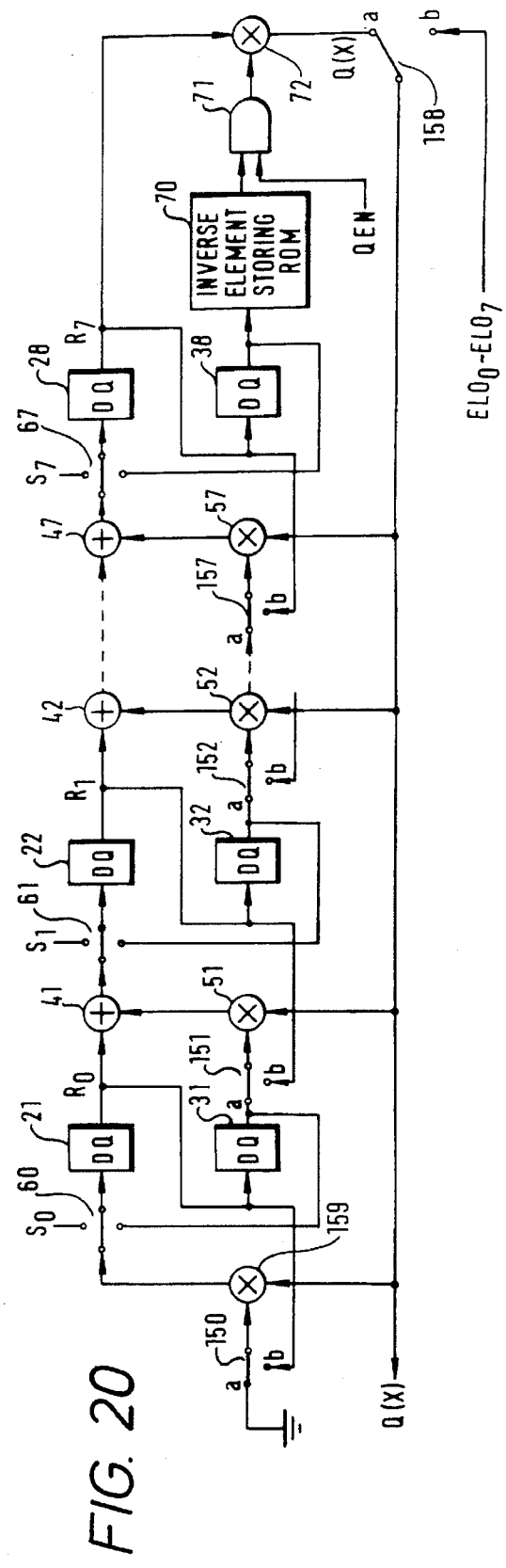
FIG. 20 is an explanatory diagram for explaining the operation of the embodiment shown in FIG. 10.
Figure 21:
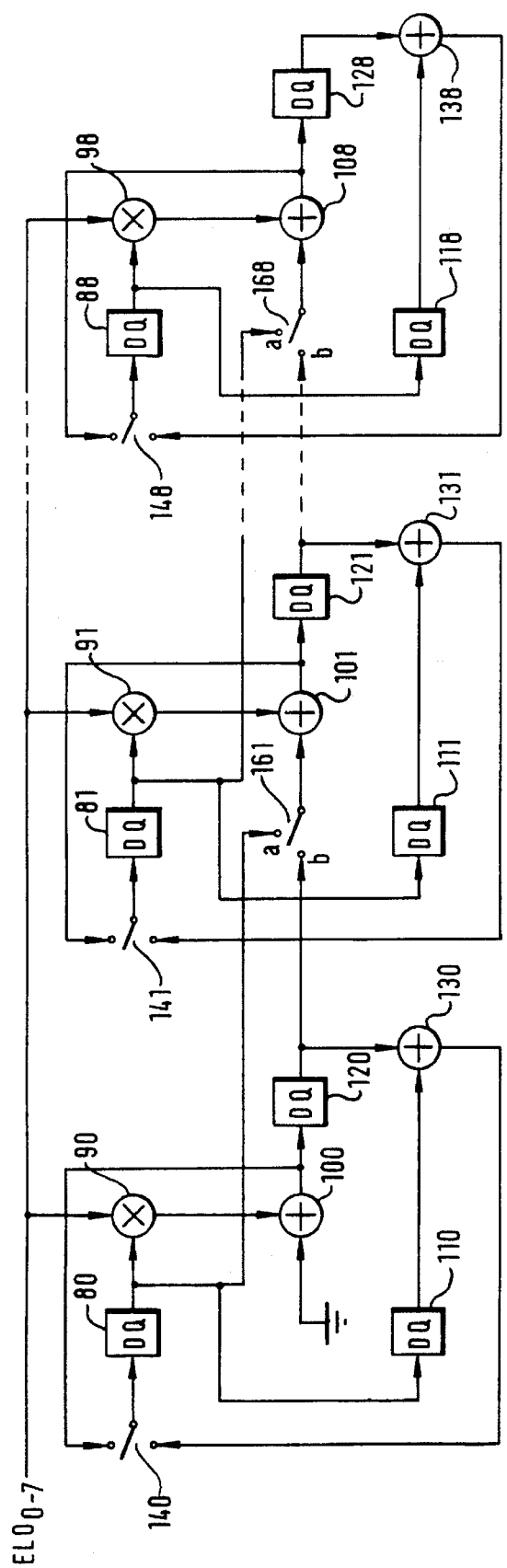
FIG. 21 is an explanatory diagram for explaining the operation of the embodiment shown in FIG. 10.
Figure 22:
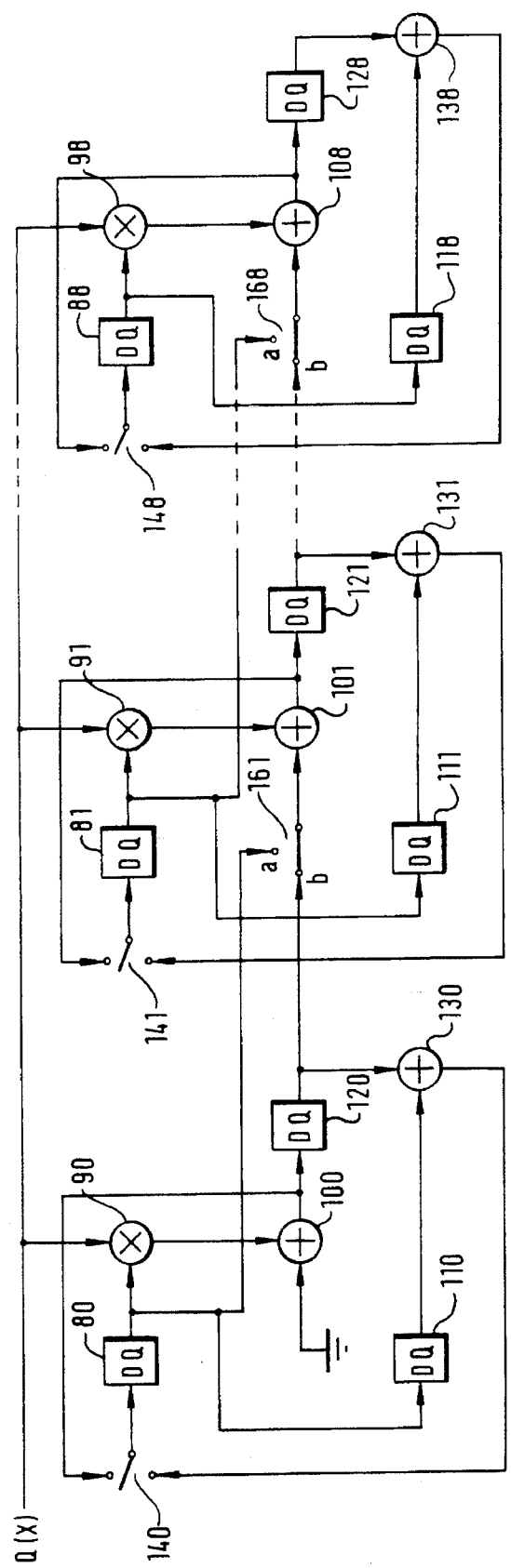
FIG. 22 is an explanatory diagram for explaining the operation of the embodiment shown in FIG. 10.

That is, erasure location data ELO0 through ELO7 are input to the multipliers 159 and 51 through 57 via the switch 158, and the multipliers 159 and 51 through 57 multiply them by syndromes from the Ri register. The results of this multiplication are added to the output from the Ri register at the front stage by the adders 41 through 47 and stored in the Ri register in the next stage via the switches 60 through 67. In this way, it is known that the circuit state shown in FIG. 19 is equivalent to the circuit shown in FIG. 12. Further, the signal SFTN in this case is always at "L". When the input of erasure location data is completed, coefficients of modified syndromes are kept in the Ri register.

Next, by selecting outputs from the resisters 31 through 38 by the switches 60 through 67 and the terminals a by the switches 150 through 157 and 159, the modified syndrome operating circuit is changed to the connection for the Euclid's algorithm division. In this case, the circuit is connected as shown by the thick line in FIG. 20. As is clear from the comparison of FIGS. 20 and 13, the Euclid's algorithm divider is constructed by the state of connection shown in the thick line in FIG. 20. Further, in this case, a quotient Q(X) is output from the multiplier 72 via the terminal a of the switch 158. The modified syndrome generating operation and the Euclid's algorithm division are carried out in this way by the circuit shown in FIG. 11.

Figure 4:
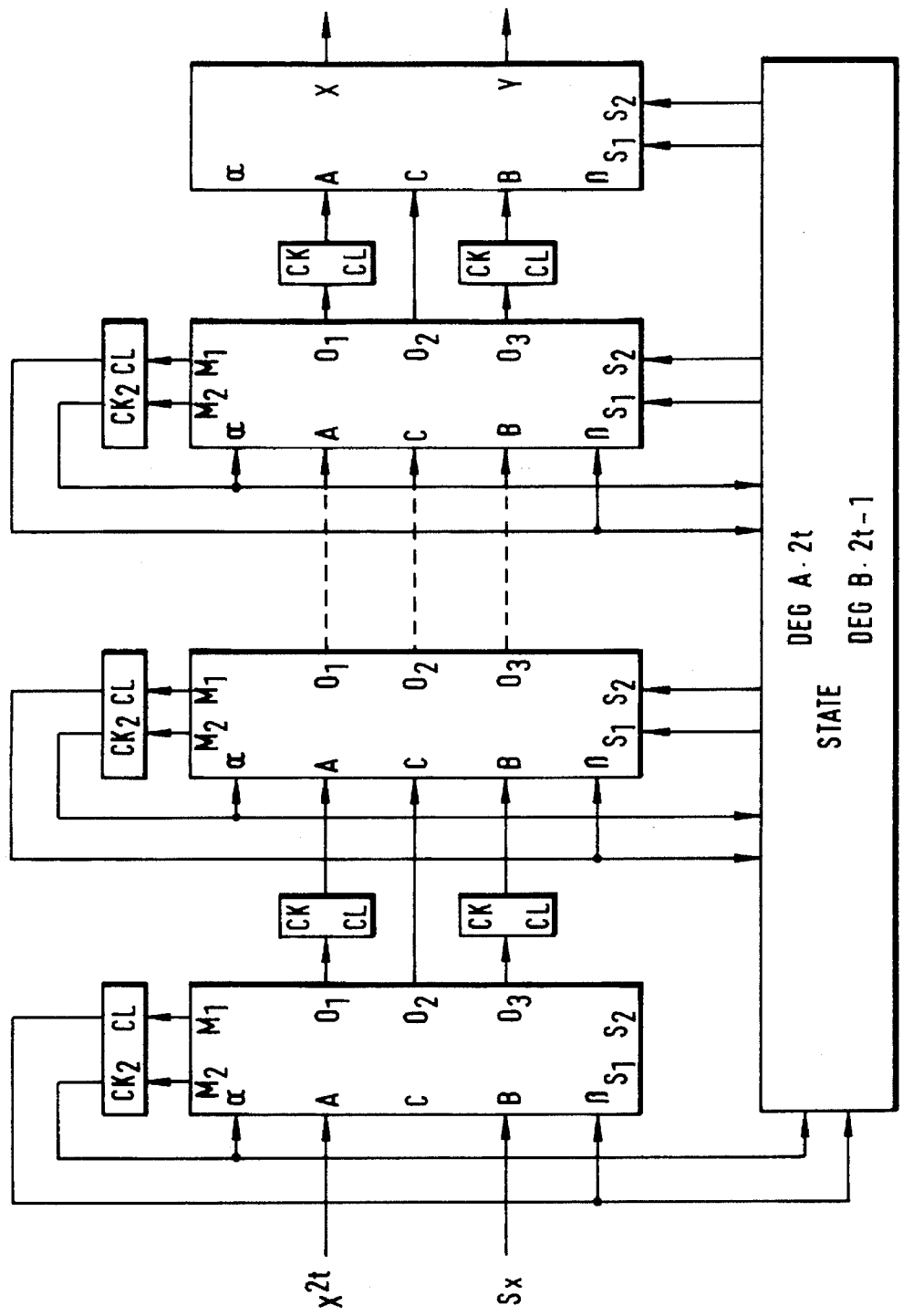
FIG. 4 is a block diagram showing the entire circuit arrangement of a conventional Euclid's algorithm operation circuit using the processing elements shown in FIG. 3.

On the other hand, the erasure locator polynomial generating/Euclid's product sum operating circuit 4 shown in FIG. 4 is the product sum operating circuit shown in FIG. 16 with the switches 161 through 168 added and first, generates an erasure locator polynomial from the erasure location coefficients (ELO0 through ELO7) and then, generates an error locator polynomial through the product sum operation for Euclid's algorithm.

That is, when the syndrome operation is completed, the switches 140 through 148 select the outputs from the adders 100 through 108, 1 is loaded on the lowest register only and 0 are loaded on all other resisters. Then, the switches 161 through 168 select the terminals a. As a result, the circuit shown in FIG. 14 becomes the connected circuit state as shown by the thick line in FIG. 21.

Then, the erasure location coefficients EL0 through EL7 are input to the multipliers 90 through 98 and the outputs from the multipliers 90 through 98 and the outputs from the resisters 80 through 187 in the front stabs are input and the outputs from the adders 100 through 108 are input to the registers 180 through 188, and a circuit for erasure locator polynomial generating operation equivalent to the circuit shown in FIG. 12 is constructed. Further, in the erasure locator polynomial generating operation, the signal LDN3 is always kept at "L". When the input of erasure locator coefficients is completed, the coefficients of the erasure locator polynomial are kept stored in the registers 180 through 188.

Then, the switches 140 through 148 select the outputs from the adders 130 through 148 and the switches 161 through 168 select the terminals b. That is, in this case, the circuit becomes the connected state as shown by the thick line in FIG. 22. As is clear from the comparison of FIGS. 22 and 16, the product sum operating circuit for Euclid's algorithm is constructed by the connection shown by the thick line in FIG. 22.

Further, in this case, a division quotient Q(X) is supplied to the multipliers 90 through 98 instead of the erasure locator coefficients ELO0 through ELO7. The erasure locator polynomial generating operation and Euclid's product sum generating operation are carried out in this way.

In the second embodiment of the decoder, using the modified syndrome generating/Euclid's algorithm divider 3 in a simple circuit arrangement with switches added to the Euclid's algorithm divider, the division for Euclid's algorithm is carried out using registers for holding modified syndromes obtained through the modified syndrome generating operation. Further, using the erasure locator polynomial generating/Euclid's algorithm product sum operating circuit in a simple circuit arrangement with switches added to the product sum operating circuit for Euclid's algorithm, the product sum operation for Euclid's algorithm is carried out by utilizing the registers for holding the modified syndromes obtained by the erasure locator polynomial generating operation. It is possible to reduce the circuit scale remarkably by commonly using these circuits and it becomes easy to achieve the large scale integration.

Figure 2:
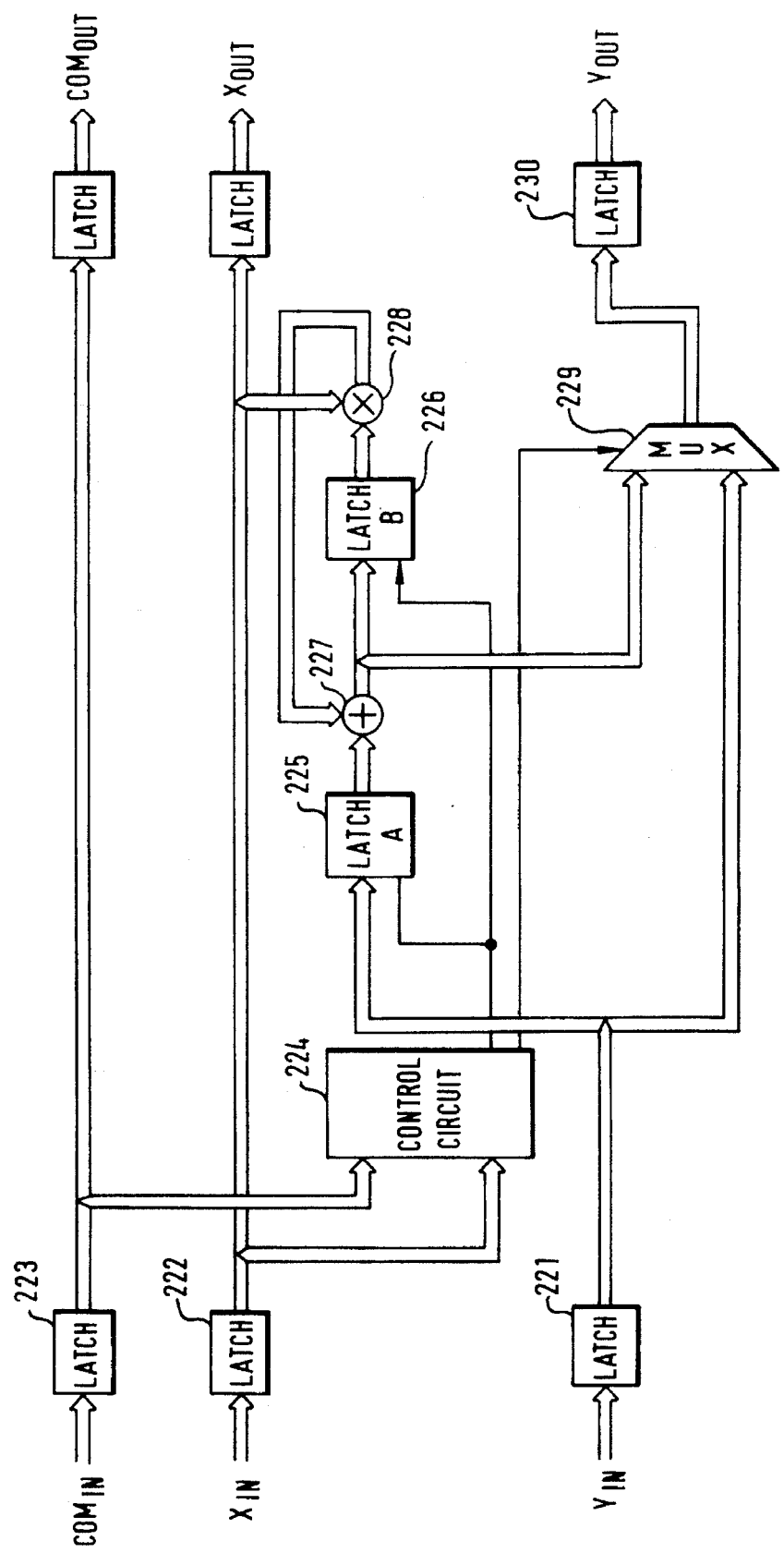
FIG. 2 is a circuit diagram showing a modified syndrome circuit in FIG. 1.

Further, while data obtained from the operation are transferred and an operating time is regulated using the I/F in the conventional decoder shown in FIGS. 1 and 2, the decoder of the present invention has such merits that no data transfer is required and the processing speed can be promoted as the circuits are commonly used and furthermore, the registers for storing obtained syndrome coefficients or erasure locator polynomial coefficients and the registers in which these coefficients are to be loaded in order to carry out next division or product sum operation are commonly used.

Further, the present invention is not limited to the embodiments described above. For instance, the number of parities on the Galois field $GF(2^4)$ is explained to be 8 but the present invention can be implemented on the Galois field $GF(2^8)$ and as to the number of parities, it is possible to easily cope with any number of parities only by increasing the number of cells and changing the degree judgement.

As described above, the present invention can provide an extremely preferable decoder.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A Euclid's algorithm operation circuit for repeatedly dividing dividend polynomials by residues from the division of dividend polynomials and division polynomials until degrees of the residues satisfy prescribed conditions, the Euclid's algorithm operation circuit comprising:

a first register group and a second register group each having a plurality of registers for storing the dividend polynomials and the division polynomials;

a feedback loop for storing residues resulting from the division of the dividend polynomials by the division polynomials in registers of the first register group using the first and the second register groups;

a shifter for shifting the contents of the registers of the first register group to registers in the next stage whenever one time of division is completed until the maximum degree coefficient of the division polynomials become non-zero; and an exchanger for exchanging the coefficients of the dividend polynomials with the coefficients of the division polynomials.

2. A decoder comprising:

a syndrome operator for calculating syndromes from received code-words;

an erasure locator generator for generating erasure locator data from erasure locator flags synchronous with received code words;

a modified syndrome generator for generating modified syndromes excepting erasure locator information from the syndromes;

an erasure locator polynomial generator for generating erasure locator polynomials from the erasure locator data;

a Euclid's algorithm operation circuit for obtaining error locator polynomials and error value polynomials from the modified syndromes and the erasure locator polynomials;

A Chien searcher for obtaining error locations and error values from the error locator polynomials and the error value polynomials obtained by the Euclid's algorithm operation circuit; and a correction processor for correcting errors of the received code-word based on error locations and error values obtained by the Chien searcher;

the modified syndrome generator and the erasure locator polynomial generator being used jointly with the Euclid's algorithm operation circuit.

3. A decoder as claimed in claim 2, wherein:

the Euclid's algorithm operation circuit includes a divider and a product sum operating circuit for Euclid's algorithm; and the modified syndrome generator is used jointly with the divider of the Euclid's algorithm operation circuit and the erasure locator polynomial generator is used jointly with the product sum operating circuit for Euclid's algorithm.

4. A decoder as claimed in claim 2, wherein:

the Euclid's algorithm operation circuit includes a divider and a plurality of registers; and the divider of the Euclid's algorithm operation circuit obtains error locator polynomials by performing a division process generating coefficients of dividend polynomials until maximum degree coefficients of the dividend polynomials become non-zero while exchanging data of the registers in which the coefficients of dividend polynomials are stored for every division process and generating modified syndromes using the registers holding the coefficients of dividend polynomials.

5. A decoder as claimed in claim 2, wherein:

a product sum operating circuit for Euclid's algorithm generates the erasure locator polynomials using resisters for multiplication.

6. A decoder comprising:

a syndrome operator for calculating syndromes from received code-words;

an erasure locator generator for generating erasure locator data from erasure locator flags synchronizing with received code-words;

a first cell group comprising a plurality of first cells connected, each of which has a first and a second registers; a first adder and a first multiplier;

a modified syndrome generator for generating modified syndromes excepting erasure locator information from the syndromes using the first register, the first adder and the first multiplier by providing the syndromes and the erasure locator data to the first cell group and for storing them in the first register;

a Euclid's algorithm divider for obtaining error value polynomials from the modified syndromes and the erasure locator polynomials stored in the first register using the first and the second registers, the first adder and the first multiplier;

a second cell group comprising a plurality of second cells connected, each of which has a third, a fourth and a fifth registers, a second adder and a second multiplier an erasure locator polynomial generator for providing the erasure locator data to the second cell group and generating erasure locator polynomials using the third register, the second adder and the second multiplier, and storing them in the third register;

a Euclid's algorithm operation circuit that is provided with a quotient from the Euclid's divider and obtains an error locator polynomial using the third, the fourth and the fifth registers, the second adder and the second multiplier from the erasure locator polynomials stored in the third register and the quotient;

a Chien searcher for obtaining error locations and error values from error value polinomials and error locator polynomials obtained by the divider and product sum operation circuit for Euclid's algorithm, respectively; and a correction processor for correcting the errors of received code-words based on the error locations and error values obtained by the Chien searcher.

* * * * *